US010963608B2

(12) United States Patent
James et al.

(10) Patent No.: US 10,963,608 B2
(45) Date of Patent: Mar. 30, 2021

(54) SYSTEM AND METHOD FOR PASSIVE VERIFICATION

(71) Applicant: ZIPALOG, INC., Plano, TX (US)

(72) Inventors: Felicia James, Carrollton, TX (US); Michael Krasnicki, Richardson, TX (US)

(73) Assignee: ZIPALOG, INC., Plano, TX (US)

( * ) Notice: Subject to any disclaimer, the term of this patent is extended or adjusted under 35 U.S.C. 154(b) by 0 days.

(21) Appl. No.: 16/828,189

(22) Filed: Mar. 24, 2020

(65) Prior Publication Data

US 2020/0218843 A1 Jul. 9, 2020

Related U.S. Application Data

(63) Continuation of application No. 16/459,717, filed on Jul. 2, 2019, now Pat. No. 10,599,793, which is a (Continued)

(51) Int. Cl.
*G06F 30/33* (2020.01)
*G06F 13/42* (2006.01)
(Continued)

(52) U.S. Cl.
CPC .......... *G06F 30/33* (2020.01); *G06F 12/0875* (2013.01); *G06F 13/4282* (2013.01); *G06F 30/367* (2020.01)

(58) Field of Classification Search
USPC ........................................................ 716/106
See application file for complete search history.

(56) References Cited

U.S. PATENT DOCUMENTS

2006/0064607 A1 3/2006 Tada et al.
2007/0277130 A1 11/2007 Lavelle
(Continued)

OTHER PUBLICATIONS

Patent Cooperation Treaty: International Search Report and Written Opinion for related PCT/US16/29552; Lee W. Young; dated Aug. 18, 2016; 15 pages.

*Primary Examiner* — Mohammed Alam

(57) ABSTRACT

A computer implemented method of passive verification of an electronic design, includes the steps of receiving a first electronic design file of a first electronic design comprised at least in part of a mixed signal or analog system, the first electronic design file including at least one first system and first subsystem, collecting first input data from at least one first system input and first subsystem input, analyzing a first parameter of the first input data, receiving a second electronic design file of a second electronic design comprised at least in part of a mixed signal or analog system, the second electronic design file including at least one second system and second subsystem that are comparable in function to the at least one first system and first subsystem of the first electronic design file, collecting second input data from at least one second system input and second subsystem input of the second design file, analyzing the first parameter of the second input data, comparing the analysis of the first parameter of the first input data of the at least one first system and first subsystem in said first design file to the analysis of the first input parameter of the second input data of the least one second system and second subsystem in the second design file and repeating the comparison for a series of input parameters to build a history of verification coverage of input parameters of the at least one second system and second subsystem of the second design file relative to the at least one first system and first subsystem of the first design file.

20 Claims, 21 Drawing Sheets

Related U.S. Application Data continuation of application No. 15/889,932, filed on Feb. 6, 2018, now Pat. No. 10,339,237, which is a continuation of application No. 15/139,835, filed on Apr. 27, 2016, now Pat. No. 9,886,536.

(60) Provisional application No. 62/153,046, filed on Apr. 27, 2015, provisional application No. 62/153,047, filed on Apr. 27, 2015.

(51) Int. Cl.
*G06F 12/0875* (2016.01)
*G06F 30/367* (2020.01)

(56) References Cited

U.S. PATENT DOCUMENTS

| | | |
|---|---|---|
| 2011/0054875 A1 | 3/2011 | Chang et al. |
| 2013/0024178 A1 | 1/2013 | Kumaragurumathan |
| 2013/0117610 A1 | 5/2013 | Nakamura |
| 2015/0007124 A1 | 1/2015 | Krasnicki et al. |
| 2015/0302125 A1 | 10/2015 | Krasnicki et al. |
| 2015/0324505 A1 | 11/2015 | James et al. |
| 2016/0314228 A1 | 10/2016 | James et al. |
| 2018/0260505 A1 | 9/2018 | James et al. |

SYSTEM AND METHOD FOR PASSIVE VERIFICATION

CROSS-REFERENCE TO RELATED APPLICATIONS

This application is continuation of U.S. Continuation application Ser. No. 16/459,717, filed Jul. 2, 2019, and entitled SYSTEM AND METHOD FOR PASSIVE VERIFICATION, which is a continuation of U.S. Continuation application Ser. No. 15/889,932, filed Feb. 6, 2018, and entitled SYSTEM AND METHOD FOR PASSIVE VERIFICATION, which is a continuation of U.S. patent application Ser. No. 15/139,835, filed on Apr. 27, 2016, and entitled SYSTEM AND METHOD FOR PASSIVE VERIFICATION, now U.S. Pat. No. 9,886,536, issued Feb. 6, 2018. U.S. application Ser. No. 15/139,835 claims the benefit of U.S. Provisional Application No. 62/153,047, filed Apr. 27, 2015, and entitled LATERAL PASSIVE VERIFICATION and to U.S. Provisional Application No. 62/153,046, filed Apr. 27, 2015, and entitled PASSIVE VERIFICATION. U.S. application Ser. Nos. 15/889,932, 15/139,835, 62/153,047 and 62/153,046 are incorporated by reference herein in their entirety.

BACKGROUND

The method and system and is particularly useful in, but not limited to the passive verification of analog and mixed signal integrated circuits.

Electronic design automation (EDA) is software for designing electronic blocks. There are several broad types of electronic signals, components and blocks, digital, analog and a mixture of digital and analog termed mixed signal. The electronic design generally comprises at least one of the following levels of circuit information, a system level, an architectural level, a dataflow level, an electrical level, a device level and a technology level and/or the like.

Digital signals have discrete input and output values "0" and "1", occurring at discrete time values, typically tied to a clock signal. Digital components which input and output the digital signals typically have static pin outs and inter-action protocols. Digital blocks comprised of the digital components have well established and well documented physical layouts and electrical interactions. The simulators for digital blocks are discrete time event driven simulators.

Analog signals generally have continuous input and output values that may vary over time. Analog components typically have customizable layouts, in order to modify inputs, outputs, triggers, biases, etc. Therefore, due to customization, analog blocks comprised of the analog components, may not have well established or well documented physical layouts or electrical interactions. The simulators for analog blocks generally necessitate continuous time domain simulators.

Mixed signal blocks are a combination of digital signal blocks and analog signal blocks within a component being simulated. The most common options available for simulation are to simulate the component as a grouping of analog blocks, or, to separately analyze the analog components/blocks and the digital components/blocks and translate the inputs and outputs at the boundaries of the digital and analog domains for inter-domain communication.

Within EDA there are two broad categories of circuit review that are often related, simulation and verification. Simulation is a numerical solution set that predicts the behavior of a circuit. Verification is the systematic pursuit of describing the behavior of a circuit under relevant conditions (functional verification) and over manufacturing process variation (parametric verification). Therefore, verification generally necessitates a much more extensive review of the circuit, its operating conditions and manufacturing operation variations than a simulation. It is possible to run a large number of simulations without verifying to any significant degree the functionality of a circuit. Verification is the mathematical modeling of circuit behavior and evaluation of circuit performance over a range of conditions. Ultimately, the measure of success of verification is to report how well the circuit design complies with the circuit specification. Analog and mixed signal verification methodology is struggling to keep pace with the complexity, cost, and computational demands of ever-growing analog and mixed signal circuits.

The number and complexity of verification test cases grows with the complexity of analog and mixed signal designs. Additionally, simulation speed decreases and memory utilization increases as the size of the circuit grows. Thus, the computational processing-power to verify a circuit may dramatically increase with circuit complexity. To make this issue more painful, verification occurs at the end of a design cycle where schedule delays are perceived to be most severe. Thus, verification is an activity that generally necessitates a significant amount of simulation processing-power for a small part of the overall design cycle, and the efficient use of verification resources is generally necessitated to meet time to market demands.

Today's complex verification solutions specifically focus engineering on the verification activity to ensure that the operation of the circuit is fully and efficiently verified under at least most pertinent conditions. This focused analog and mixed signal verification is much more manual and experience driven than digital verification. There is a long felt need to gain as much information from the verifications that have been run to reduce duplicate simulations and to insure that primary and secondary sub-circuit simulations are aligned internal to the circuit and externally to the test bench.

Robust verification of analog and mixed signal circuits generally necessitates a significant investment in test benches, performance analysis routines, and macro-models that may be used to accelerate the simulations. The complexity of this collateral grows with the complexity of the analog and mixed signal integrated circuits. As a design team adds design resources it also needs to add verification resources, adding to the cost of the design. The efficient use of those resources becomes paramount due to the inevitable time constraints that are imposed at the end of the design cycle, when companies are trying to get a product to market.

The current technology trajectory within the electronics manufacturing industry is to move more and more toward single chip designs, called Systems on a Chip (SoC). Most systems on a chip generally necessitate some level of mixed signal verification. As mixed signal designs continue to increase in size and complexity, this places additional burdens on verification to insure first pass design success and reducing time-to-market. Although the complexity of analog and mixed signal ASIC design has aggressively followed Moore's law, innovations in design verification generally have not.

Valuable design time and compute resources as well as expensive simulator resources may be saved by the disclosed method for achieving verification coverage based on passive data collection of simulations that have been and are being run. This historical sampling and analysis allows an alignment of test conditions within hierarchies and between hierarchies to insure that duplicate tests are avoided and that untested conditions are identified.

Therefore the disclosure implements improved verification efficiency through utilization of historical data acquired through passive recording and analysis. These and other potential advantageous, features, and benefits of the present disclosure may be understood by one skilled in the arts upon careful consideration of the detailed description of representative examples of the disclosure in connection with the accompanying drawings.

SUMMARY

The present invention, as disclosed and described herein, in one aspect thereof comprises a computer implemented method of passive verification of an electronic design, comprising receiving an electronic design file of said electronic design comprised at least in part of a mixed signal or analog system including a plurality of subsystems. At least one analog subsystem of the plurality of subsystems has at least two design representations within the electronic design file that are intended to be equivalent for the at least one analog subsystem being simulated. First input subsystem data is collected for a first subsystem design representation of the at least two design representations from an analog stimulus to at least one input of the first subsystem design representation which is analog. First output subsystem data is collected from at least one output of the first subsystem design representation of the at least two design representations caused by the analog stimulus to the at least one input of the first subsystem design representation. At least one parameter of said first input subsystem data is analyzed with respect to said first output subsystem data. Second input subsystem data is collected for a second subsystem design representation of the at least two design representations from an analog stimulus to at least one input of the second subsystem design representation which is analog. Second output subsystem data is collected from at least one output of the second subsystem design representation of the at least two design representations caused by the analog stimulus to the at least one input of the second subsystem design representation. The at least one parameter of said second input subsystem data is analyzed with respect to said second output subsystem data. The at least one parameter of the first subsystem design representation is compared with the at least one parameter of second subsystem design representation. The electronic design file of the electronic design is verified responsive to the determined analysis between the at least one input of the subsystem and the at least one output of the subsystem for each of the first and the second subsystem design representations.

BRIEF DESCRIPTION OF THE DRAWINGS

The present disclosure will be more clearly understood from consideration of the following detailed description and drawings in which.

Figure 1:
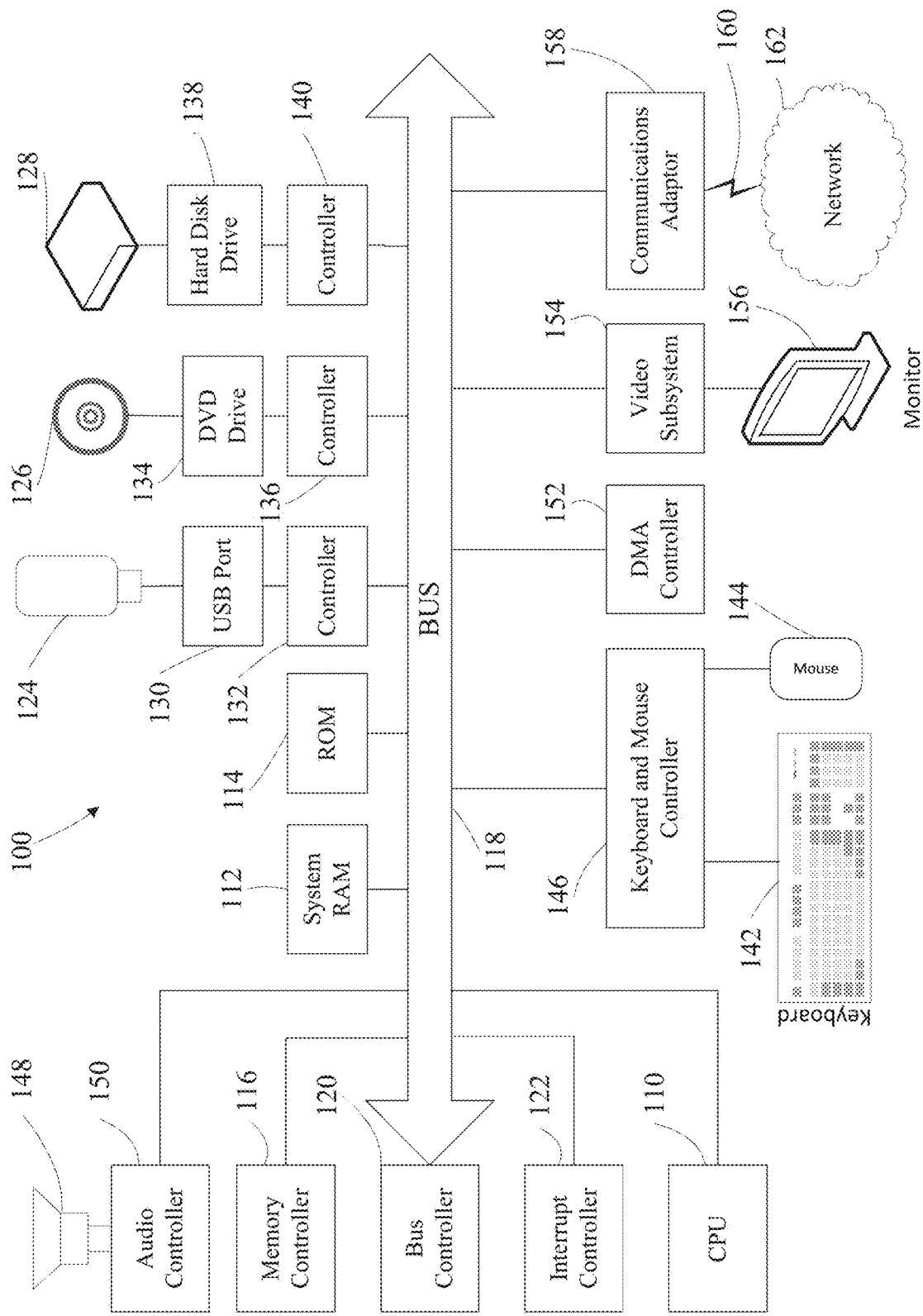
FIG. 1 is a block diagram showing a computer system suitable for practicing the instant disclosure.

References in the detailed description correspond to like references in the various drawings unless otherwise noted. Descriptive and directional terms used in the written description such as right, left, back, top, bottom, upper, side, et cetera, refer to the drawings themselves as laid out on the paper and not to physical limitations of the disclosure unless specifically noted. The drawings are not to scale, and some features of examples shown and discussed are simplified or amplified for illustrating principles and features as well as advantages of the disclosure.

DETAILED DESCRIPTION

The features and other details of the disclosure will now be more particularly described with reference to the accompanying drawings, in which various illustrative examples of the disclosed subject matter are shown and/or described. It will be understood that particular examples described herein are shown by way of illustration and not as limitations of the disclosure. Furthermore, the disclosed subject matter should not be construed as limited to any of examples set forth herein. Rather, these examples are provided so that this disclosure will be thorough and complete, and will fully convey the scope of the disclosed subject matter to those skilled in the art. The principle features of this disclosure may be employed in various examples without departing from the scope of the disclosure.

The terminology used herein is for the purpose of describing particular examples only and is not intended to be limiting of the disclosed subject matter. Like number refer to like elements throughout. As used herein the term "and/or" includes any and all combinations of one or more of the associated listed items. Also, as used herein, the singular forms "a", "an", and "the" are intended to include the plural forms as well, unless the context clearly indicates otherwise. It will be further understood that the terms "comprises", and/or "comprising" when used in this specification, specify the presence of stated features, integers, steps, operations, elements, and/or components, but do not preclude the presence or addition of one or more other features, integers, steps, operations, elements, components, and/or groups thereof. Also, as used herein, relational terms such as first and second, top and bottom, left and right, and the like may be used solely to distinguish one entity or action from another entity or action without necessarily requiring or implying any actual such relationship or order between such entities or actions.

Cost of entry barriers into analog and mixed signal IC design is endemic especially to fabless companies that are developing ASIC intellectual property in the form of packaged ASICs or modules to be integrated into their customer's Systems-on-Chip (SoCs). For example, if a fabless design center is staffed with five IC design engineers, equipping the team with design tools is financially equivalent to quadrupling the staff. This is due to the high cost of ownership of the EDA tools, not just in annual license fees, installation and support, training and the like. Reducing system use through passive verification of states that have been run and their analysis allows more efficient resource allocation.

Analog and mixed signal verification is time and compute intensive. Functionality of the circuit for various inputs, at various conditions and for various manufacturing conditions are generally necessitated to be simulated to insure that the circuit functions to the specifications. Overlapping the time and compute intensiveness of the original verification is that multiple design teams may be reviewing or modifying aspects of the design. Determining what verification tests have already been tested becomes paramount in confirming whether the circuit has been adequately verified. When designing a large digital system, it is common practice to engage a group of digital verification engineers that use a language such as SystemVerilog to develop a test suite that validates the required functionality of the digital system. Digital abstraction makes it possible to efficiently describe all expected outcomes in the tests, making brute-force re-simulation of the entire test suite easily attainable. Analog mixed-signal (AMS) circuits lack accurate abstraction. This is because they are built at the transistor-level and, due to the non-linear properties of these devices, frequently have complex behavior and input/output requirements that are not formally captured. Thus, in many cases, relevant stimulus and output requirements and limitations understood by the block-level designers are not comprehended and tracked during top-level verification. Some of this information can be captured by passively collecting information on the activities of each of the block-level designers and aggregating this information into the top-level coverage and verification flow. This invention will allow the user to explore and quantify differences between circuit block stimulus and output behavior during block-level design and top-level verification. This capability will allow the verification engineer to identify coverage gaps at the top-level and poor and incomplete testing at the block-level as well as more efficiently finding real design problems.

The present disclosure addresses capturing and analyzing individual tests that have been run to detail which tests have been run and what additional tests may need to be run. The disclosure also addresses whether the tests individually run on the subsystem align to the system inputs and outputs and whether the subsystems and secondary subsystem test conditions and outputs are aligned between the models and also to the specification, also within hierarchies and between hierarchical levels.

Therefore among the issue solved by the disclosed system and method of passive verification is to allows more efficient use of computer and personnel resources, reduce the time lag to market and insure a more timely verification through reduction in duplicate tests.

Computer System FIG. 1 illustrates the system architecture for an exemplary computer system 100 with which the current disclosure may be implemented. The exemplary computer system of FIG. 1 is for descriptive purposes only. Although the description may refer to terms commonly used in describing particular computer systems, such as an IBM personal computer, the description and concepts equally apply to other systems, including systems having architectures dissimilar to FIG. 1.

Computer system 100 typically includes a central processing unit (CPU) 110, which may be implemented with one or more microprocessors, a random access memory (RAM) 112 for temporary storage of information, and a read only memory (ROM) 114 for permanent storage of information. A memory controller 116 is provided for controlling RAM. A bus 118 interconnects the components of the computer system. A bus controller 120 is provided for controlling the bus. An interrupt controller 122 is used for receiving and processing various interrupt signals from the system components. Mass storage may be provided by, for example, flash 124, DVD 126, or hard disk 128, or a solid-state drive. Data and software may be exchanged with the computer system via removable media such as the flash drive and DVD. The flash drive is insertable into a Universal Serial Bus, USB, drive 130, which is, in turn, connected to the bus by a controller 132. Similarly, the DVD is insertable into DVD drive 134, which is, in turn, connected to bus by controller 136. Hard disk is part of a fixed disk drive 138, which is connected to the bus by controller 140.

User input to the computer system may be provided by a number of devices. For example, a keyboard 142 and a mouse 144 are connected to the bus by a controller 146. An audio transducer 148, which may act as a microphone and a speaker, is connected to bus by audio controller 150, as illustrated. Other input devices, such as a pen and/or tabloid, may be connected to the bus and an appropriate controller and software. DMA controller 152 is provided for performing direct memory access to the system RAM.

A visual display is generated by video subsystem 154, which controls video display 156. The computer system also includes a communications adaptor 158, which allows the system to be interconnected to a local area network (LAN) or a wide area network (WAN) or other suitable network, schematically illustrated by a bus 160 and a network 162.

Operation of the computer system is generally controlled and coordinated by an operating system, such as the Windows and Windows 7 operating systems, available from Microsoft Corporation, Unix, Linux or Apple OS X operating system, to name a few. The operating system controls allocation of system resources and performs tasks such as processing scheduling, memory management, networking, and I/O services, among other things.

Figure 2:
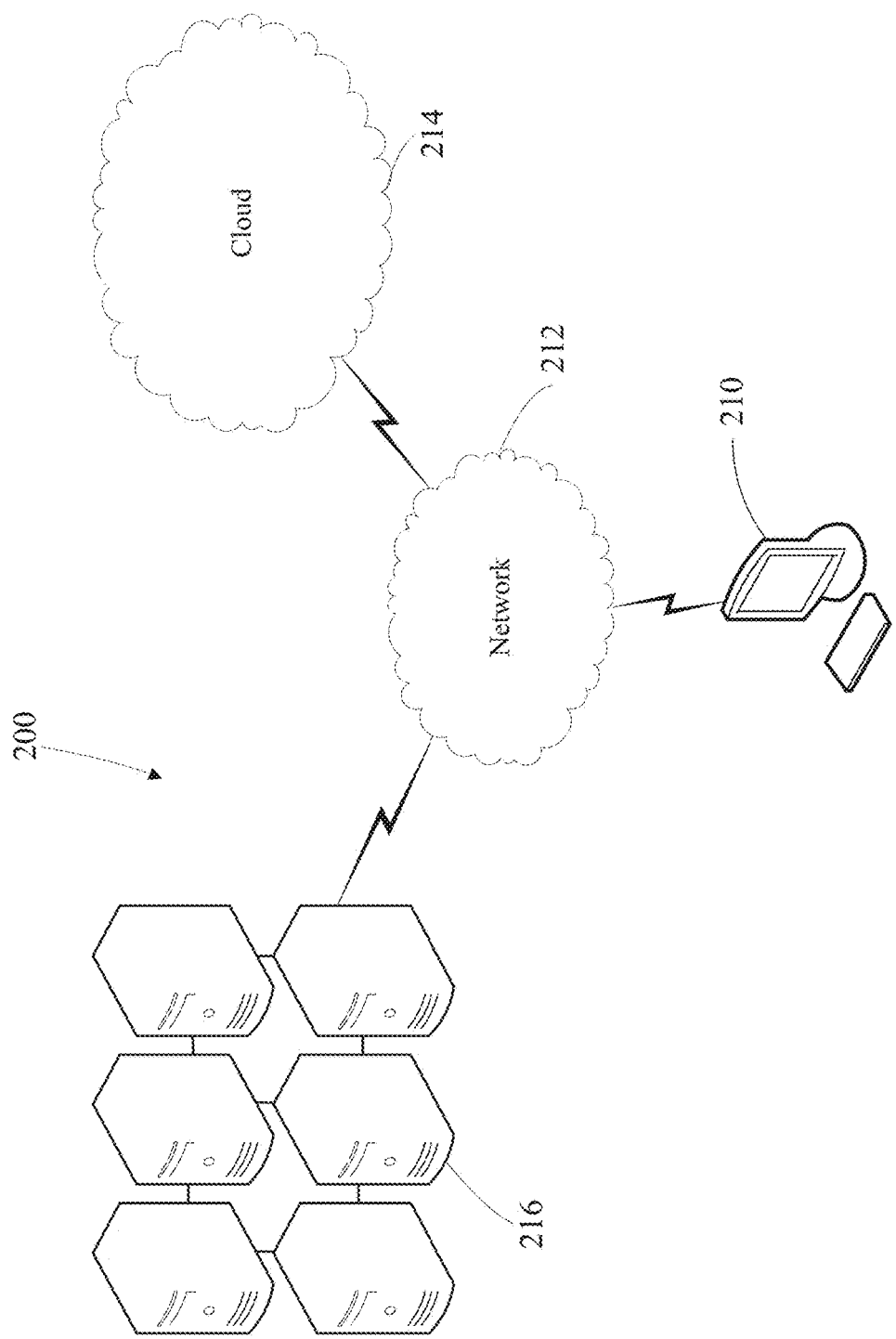
FIG. 2 is a block diagram showing a computer network system suitable for practicing the instant disclosure.

Computer System FIG. 2 illustrates the system 200 in which the computer user 210 is connected to a network 212 which in turn is connected to the cloud 214 and the compute farm 216.

Figure 3:
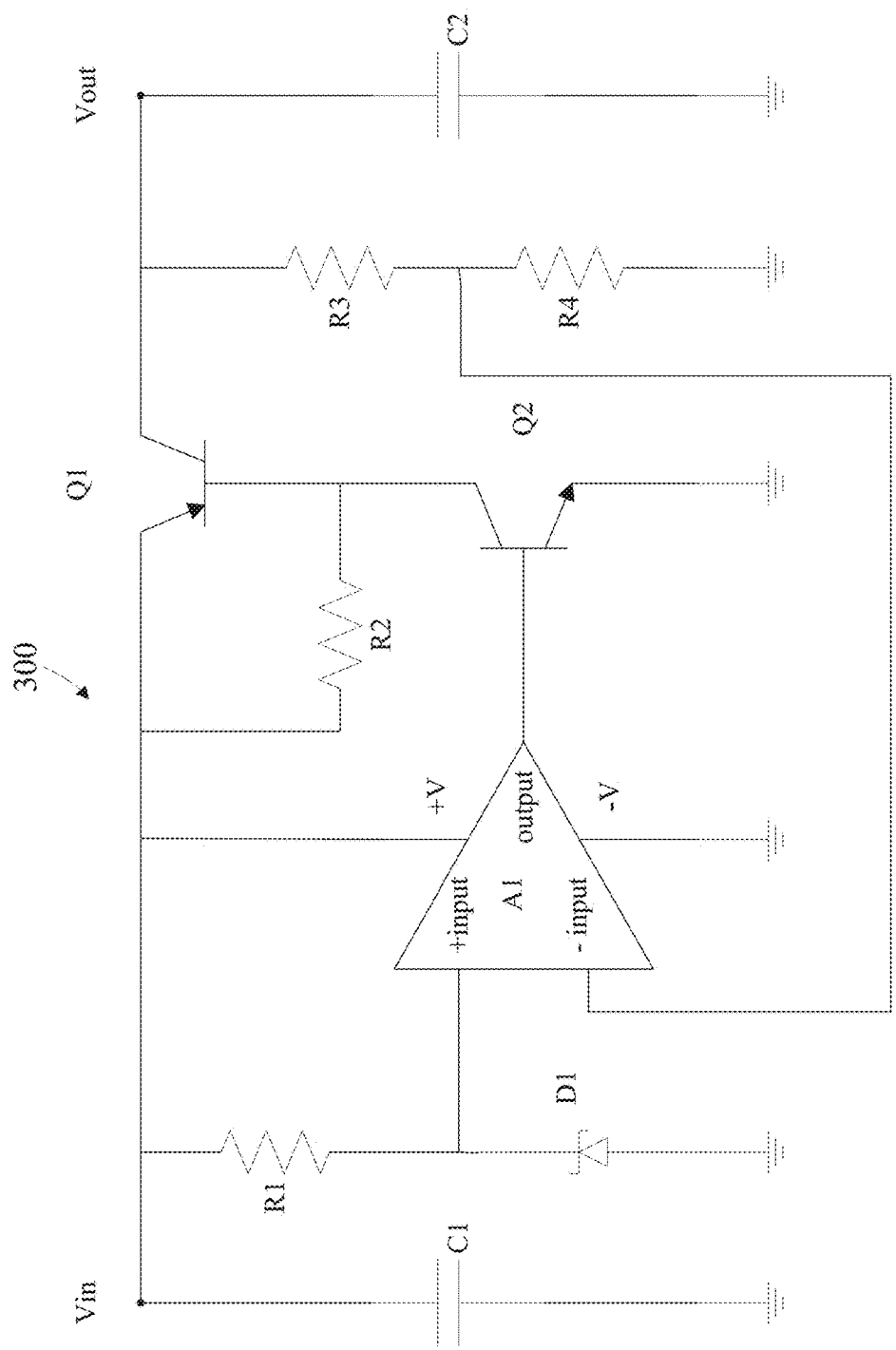
FIG. 3 depicts an example Low Voltage Dropout (LDO) circuit.

An example schematic of a low voltage dropout (LDO) 300 circuit is shown in FIG. 3. The LDO has an amplifier A1, having an inverting input (−input), a non-inverting input (+input) an output, a positive power supply voltage input +V and a negative power supply voltage input −V. The LDO circuit has a voltage in Vin and a voltage out Vout. The LDO has a power out block Q1, Q2 and R2. The LDO feedback circuit is comprised of R3, R4, D1 and R1. The amplifier A1 is termed a symbol, the elements D1, R1, R2, R3, R4, C1, C2, Q1 and Q2 are referred to as primitives.

Figure 4:
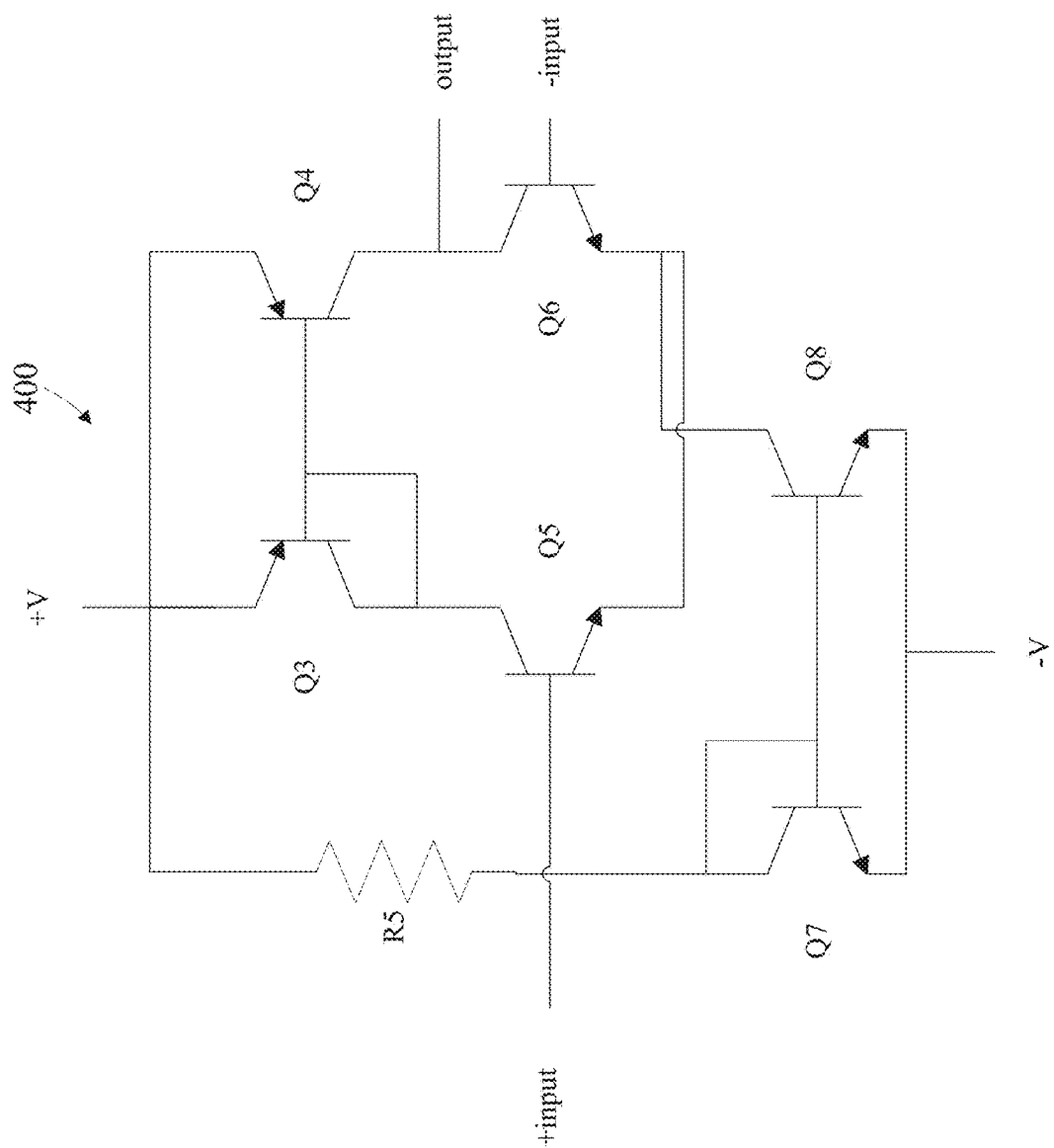
FIG. 4 depicts an example amplifier circuit.

An example schematic of an amplifier A1 400 circuit is shown in FIG. 4. The symbol of the amplifier is comprised of transistors Q3, Q4, Q5, Q6, Q7 and Q8 and resistor R5. The amplifier A1, having an inverting input (−input), a non-inverting input (+input) an output, a positive voltage input +V and a negative voltage input −V.

Figure 5:
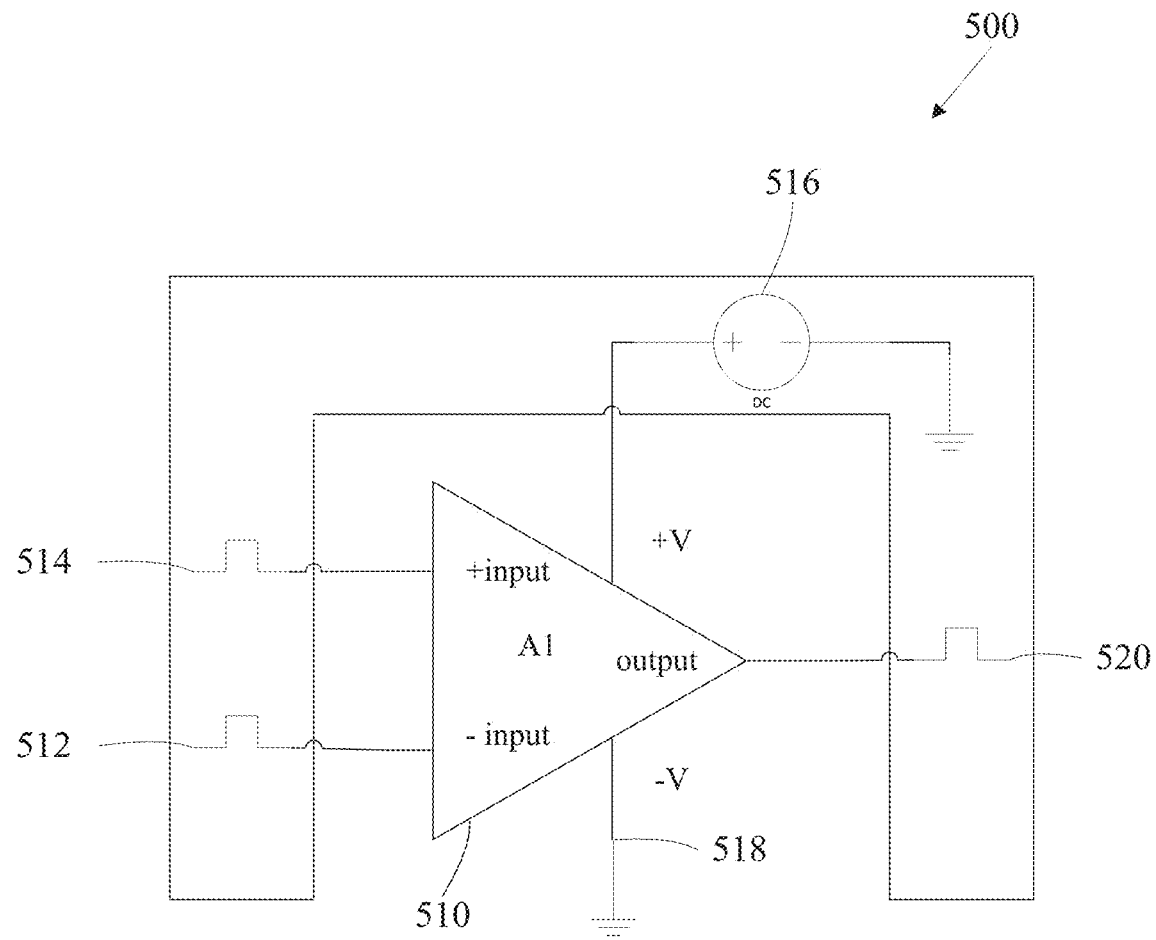
FIG. 5 depicts a test bench pin out for an amplifier.

FIG. 5 shows a test bench 500 for amplifier A1 510. A test bench is a specific configuration of inputs, outputs, test conditions and the like that are run for a device to which it is connected. The test bench has an inverting input 512, a non-inverting input 514, a positive power input 516, a negative power input 518 and an output 520. The test bench has associated connections, power supplies, IOs, etc. which are referred to as the test bench collateral. The portion around the periphery of the circuit is referred to as the verification harness. Pin outs and the operation of the verification harness need to be matched to the circuit under test.

Figure 6:
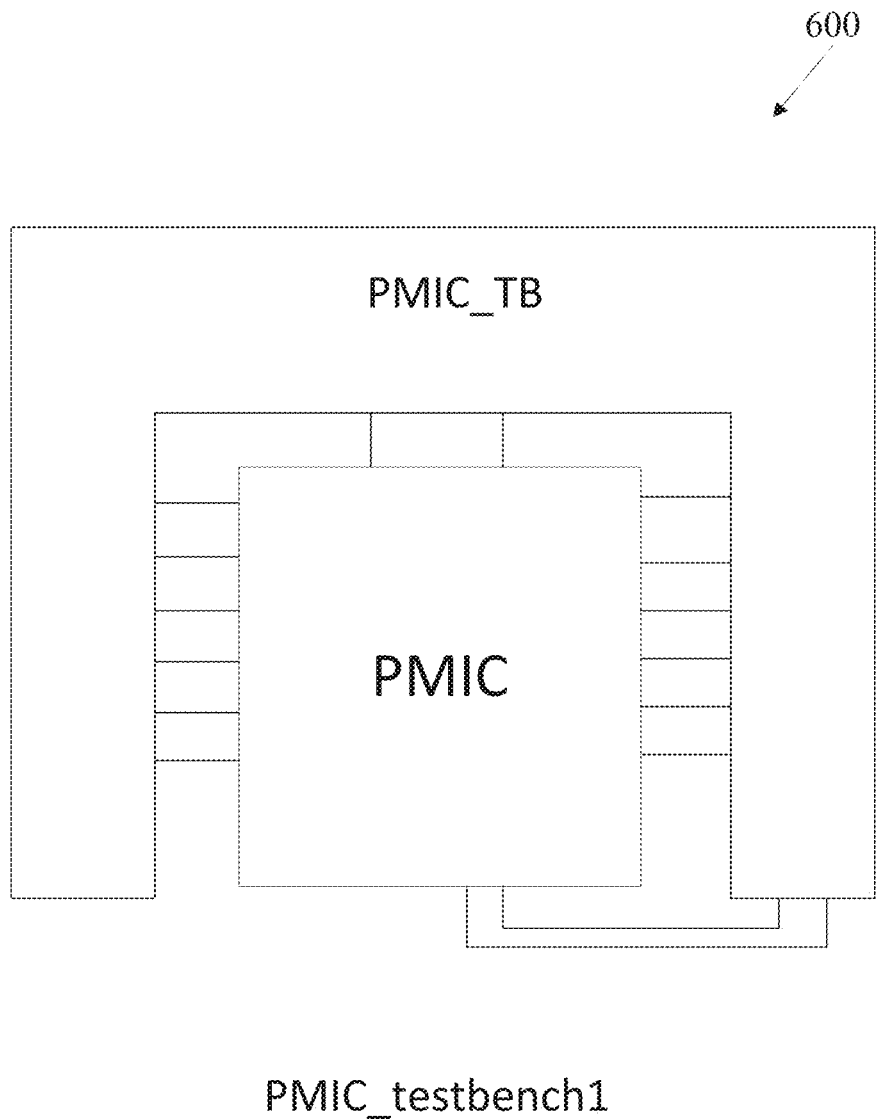
FIG. 6 depicts a schematic of a PMIC_testbench1 configuration.

FIG. 6 illustrates a schematic of PMIC_testbench1. This schematic has 2 instances: PMIC and PMIC_TB, shown in FIGS. 7 and 8.

Figure 7:
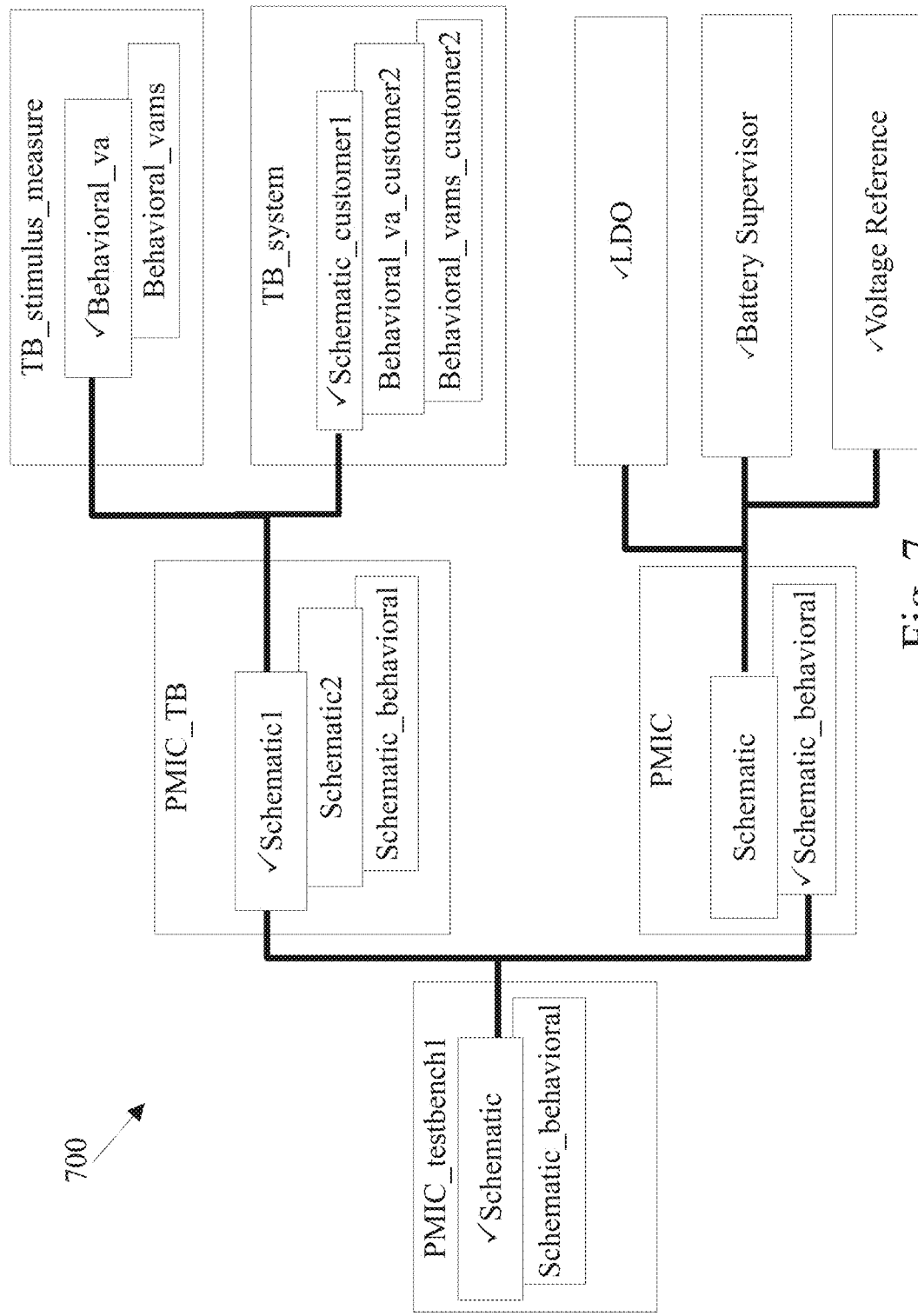
FIG. 7 depicts a first example of a design configuration of the design hierarchy for PMIC_testbench1.

FIG. 7 illustrates one possible configuration or representation of the design hierarchy for PMIC_testbench1. The PMIC_TB design representation Schematic1 includes TB_stimulus_measure Behavioral_va view and TB_system Schematic_customer1. PMIC Schematic_behavioral design configuration includes the LDO, Battery Supervisor, and Voltage reference blocks.

Figure 8:
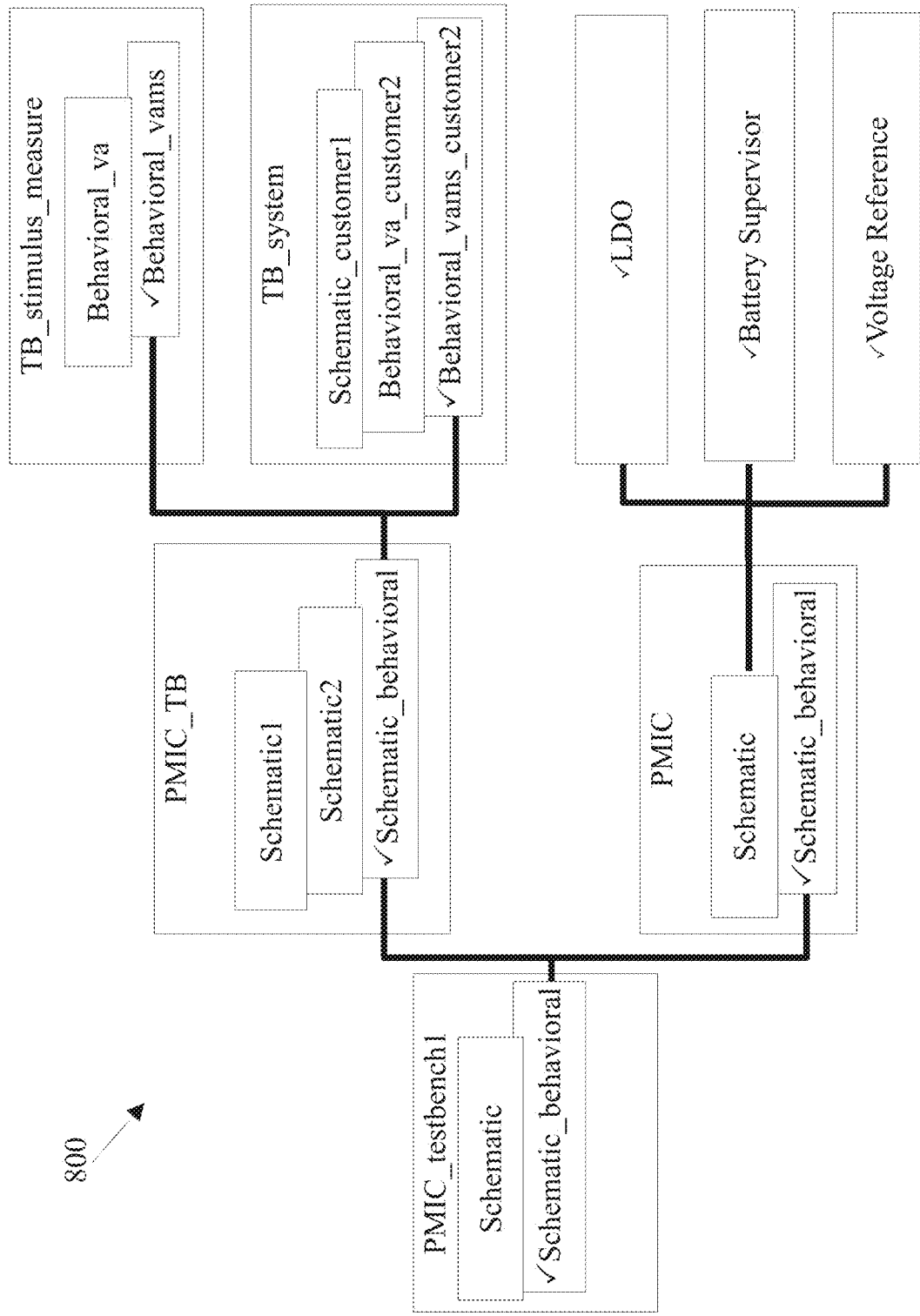
FIG. 8 depicts a second example of a design configuration of the design hierarchy for PMIC_testbench1.

FIG. 8 illustrates an alternate possible configuration where the PMIC configuration does not change but now PMIC_TB Schematic_behavioral uses TB_stimulus_measure Behavioral_vams view and TB_system Behavioral_vams_customer2 view. As with changes to the electronic design, changes in portions of PMIC_TB are relevant in the case of the change impacting the specific configuration used in a given verification run. Changes to the test bench configurations effect changes equivalent to changes in the electronic design. Different test benches may be utilized for blocks within the design hierarchy such as for the LDO or the LDO Amplifier.

Figure 9:
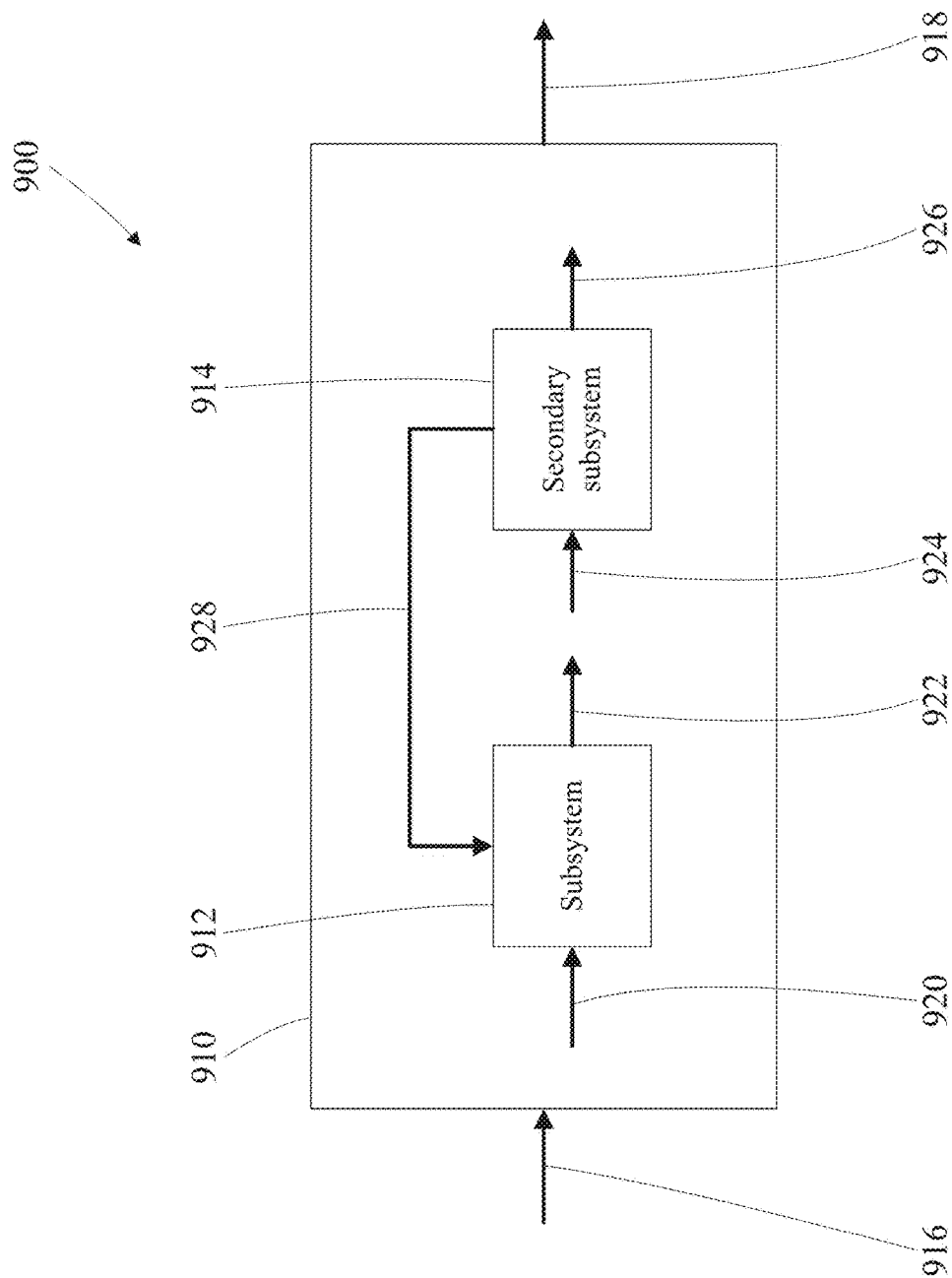
FIG. 9 depicts an example test-bench having a subsystem and a secondary subsystem.

FIG. 9 illustrates an electronic design 900 containing a system 910 and containing two sub-circuits, sub-system 912 and secondary sub-system 914. The system having an input system level data 916 and an output system level data 918. The subsystem has an input subsystem level data 920 and an output subsystem level data 922. The secondary subsystem having an input subsystem level data 924 and an output subsystem level data 926. The secondary subsystem may have feedback 928 to the subsystem.

The system 910 contains subsystems, each of which may be tested individually. Capturing the test condition inputs and outputs for each of these individual tests and the subsequent analysis of these test conditions and outputs may prove valuable. Determining whether the individual test inputs and outputs align to the external model and intra-model inputs and outputs allows us to determine deltas between outputs and inputs within the model and between inputs, outputs and the specification both within a hierarchy and between hierarchical levels. These identified deltas allow us to determine which tests have been run, which tests should receive additional attention and what conditions may have been overlooked.

Figure 10:
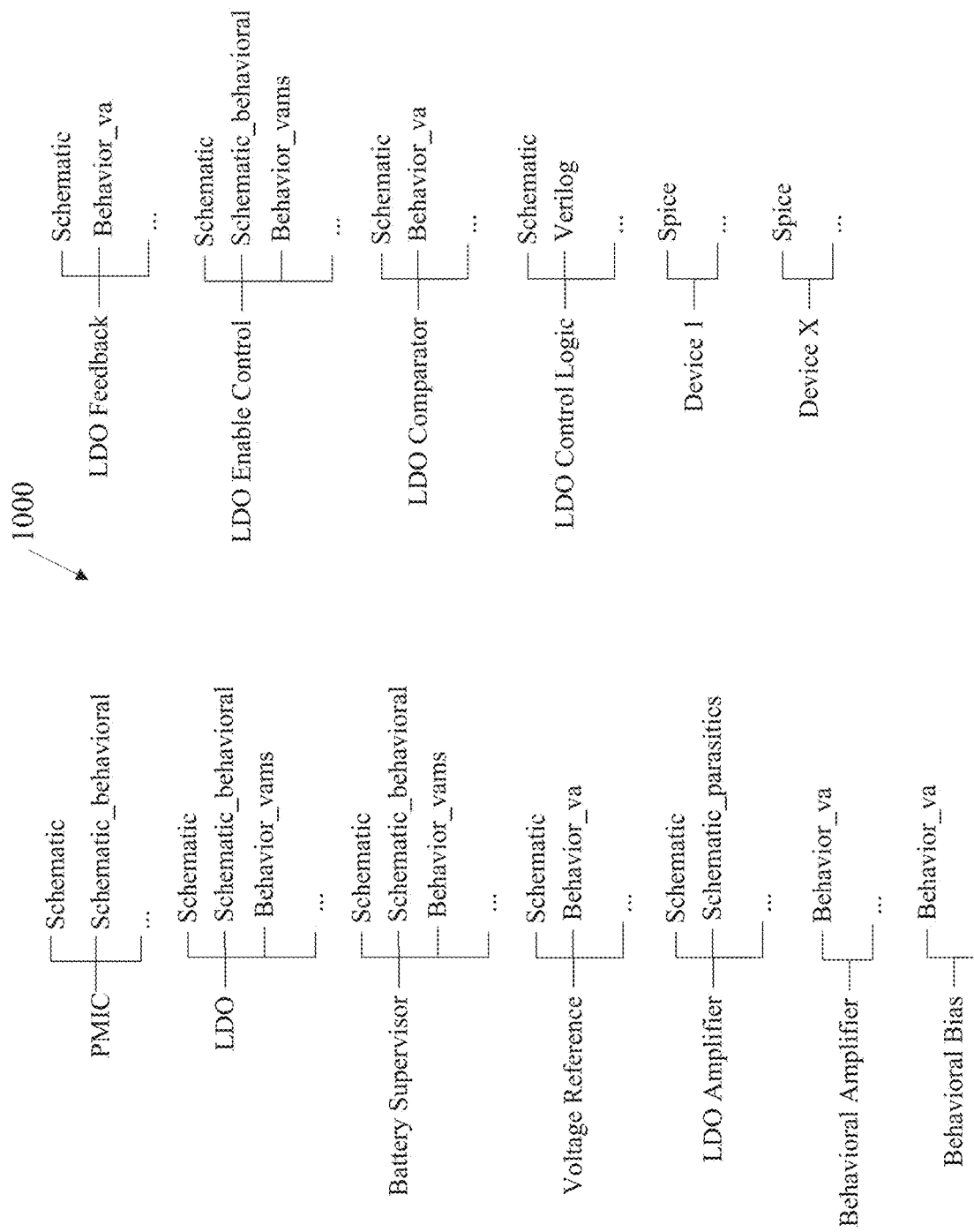
FIG. 10 depicts an instance parsed example test hierarchy.

FIG. 10 illustrates shows some of the different model views that may be chosen from for modeling a power management chip PMIC 1000. The PMIC has Schematic and Schematic_behavioral levels. The LDO, LDO Enable Control and Battery Supervisor are defined at the Schematic, Schematic_behavioral and Behavioral_vams levels. The Voltage Reference, LDO Feedback and LDO Comparator are defined at the Schematic and Behavioral_va levels. The LDO Amplifier is defined at the Schematic and Schematic_parasitics levels. The Behavioral Amplifier and Behavioral Bias are defined at the Behavior_va level. The LDO Control Logic is defined at the Schematic and Verilog levels, and Devices 1 through X are defined at the Spice level.

Figure 11:
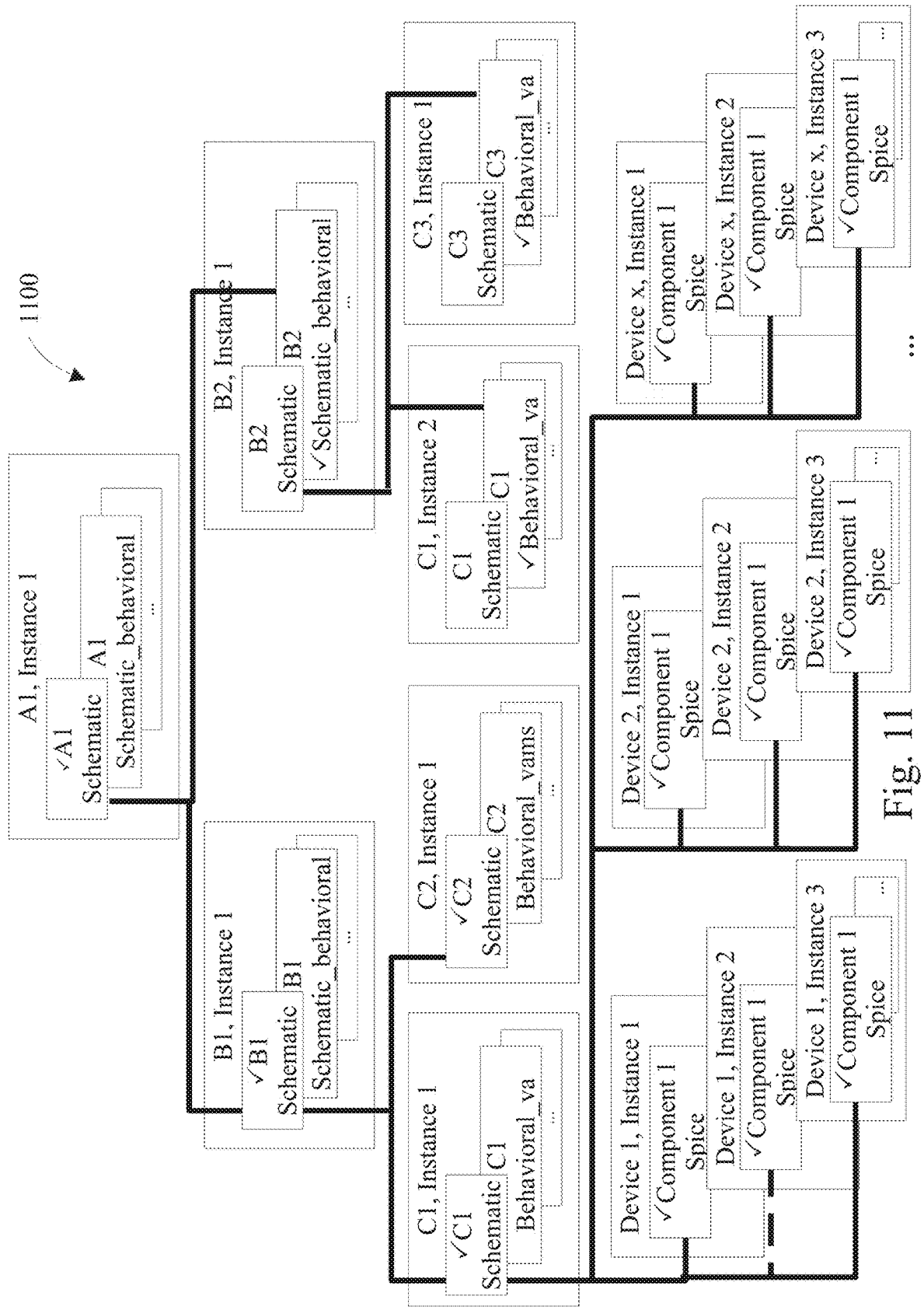
FIG. 11 depicts a general example hierarchy.

FIG. 11 illustrates a general example hierarchy 1100 of a device under test, DUT. The hierarchy is arranged according to levels, A, B, C and Device and according to instances 1, 2 and 3. The connecting lines indicate which representations are connected throughout the hierarchy for a specific verification. Within level and instance, multiple view types may exist. The examples illustrate some possible hierarchical configurations and are not intended to limit the cases and views or view types.

Integrated circuit design hierarchy is the representation of integrated circuit designs utilizing hierarchical representations. This representation allows for more efficient creation of complex designs that may include millions of components such as transistors, resistors, and capacitors as well as the metal lines that connect the devices. The design hierarchy representation used at any given point in the design process may vary based on the design step being performed and the type of design function such as analog, digital, or memory.

In the case that a design is to be manufactured: a layout of the design is created so that a representation may be mapped. This mapping allows patterns to be created on individual levels of the mask sets to allow design manufacture. In general, the design flow to create the layout representation is very different for analog as compared to digital functional blocks and subsystems.

Early in the design process, there may be large portions of the design that are designed for the first time and do not have any existing layout representations. Other portions of the design may already have been proven, and these may be represented at a higher level of abstraction or may include the layout representation.

Some common types of design representations referred to here as views may comprise various view types. A Schematic view type is a picture of components or blocks with connectivity shown by lines or nets and connections to other levels of the hierarchy through pins. A Spice view type is a representation of a component and its associated parameters, possibly including a specific device model that will be instantiated into the spice netlist. An LVSExtract is a view type that is created by a tool analyzing the layout view and reverse engineering the individual components and connectivity. Variations of this type of view may also include extracted parasitic components resulting from the physical layout that were not drawn by the designer. A Layout view type is a representation of the specific geometries including routing for that portion of the design. A Verilog view type is a text file that is in standardized Verilog format. A Verilog-A view type is a text file in standardized Verilog-A format. A Verilog-AMS view type is a text file in standardized Verilog-AMS format. View type names may be different depending on the electronic design automation tool provider.

Other types of view types may help organization and readability of the hierarchy. As an example, graphic design tools such as schematic capture systems may use a symbol view type for the graphic that is placed. The symbol may contain pins that connect the instance through the hierarchy as well as a drawing that indicates the function of the block. Examples include common symbols for operational amplifiers, basic digital gates, transistors, resistors, and the like.

Further adding to the complexity of description, a given block at a level of the design hierarchy may include multiple views of the same view type. An example would be different Verilog representations of a given block, for instance, one with annotated timing based on the layout, one with estimated timing, one without timing, or different levels of design representation such as gate-level or register transfer level RTL. Similarly, an analog view may have numerous schematic views for instance, one that will map to the final transistor-level design, one that includes placement of behavioral blocks for higher level modeling, one that may include parasitic elements from the layout, one that includes interface elements between analog and digital blocks for mixed-signal simulation. Also, for analog blocks there may be multiple Verilog-A or Verilog-AMS model views for the same block where models include different functionality and accuracy based on the purpose of different simulation exercises. These multiple views and view types are mapped into configurations that are used for a specific task or analysis.

Often view names are created to provide hints for what types of analysis a specific view may be useful. View names may include those listed hereinafter and the like. A Schematic is a schematic view including the placement of blocks that may be evaluated at the transistor level or at some level of the hierarchy such as a behavioral model. A Schematic_behavioral is a schematic view that comprises behavioral elements. A Schematic_parasitics is a schematic view that includes parasitic components extracted or estimated from the layout. A Spice is a spice view that includes the information implemented in a netlist and a component for a specific analog simulator. A Behavioral_va is a text view in the Verilog-A format that models a specific block for an analog simulator that may evaluate Verilog-A, and a Behavioral_vams is a text view in the Verilog-AMS format that models a specific block for a mixed-signal simulator that may evaluate Verilog-A and Verilog.

Figure 12:
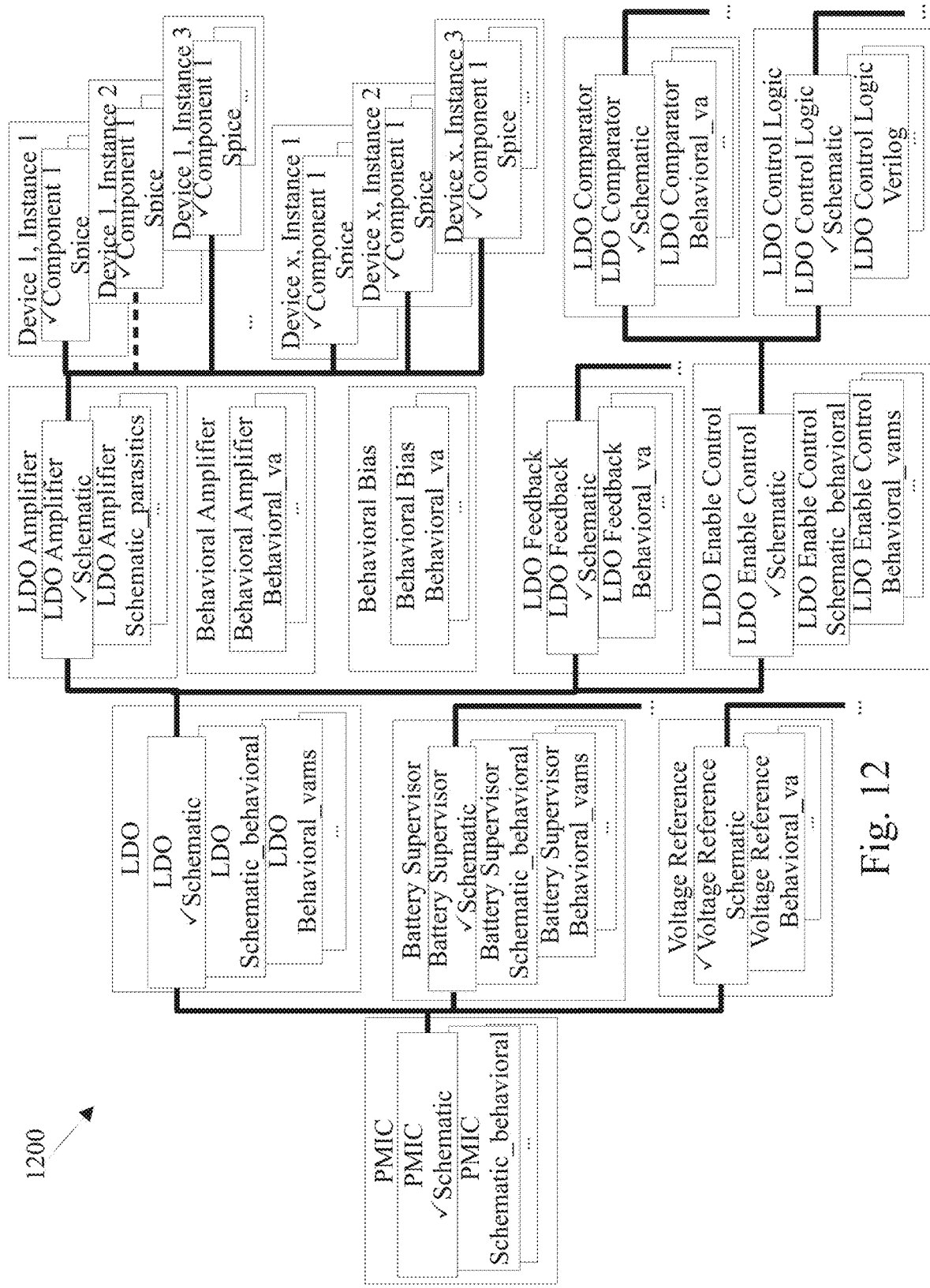
FIG. 12 depicts a first example design configuration for a power management integrated circuit.

FIG. 12 shows a test hierarchy for a power management chip 1200. The figure illustrates a portion of the hierarchy if a Spice primitive component configuration is defined. Device 1, Instance 2 is a dummy device in this model and would not change the simulator matrix.

Figure 13:
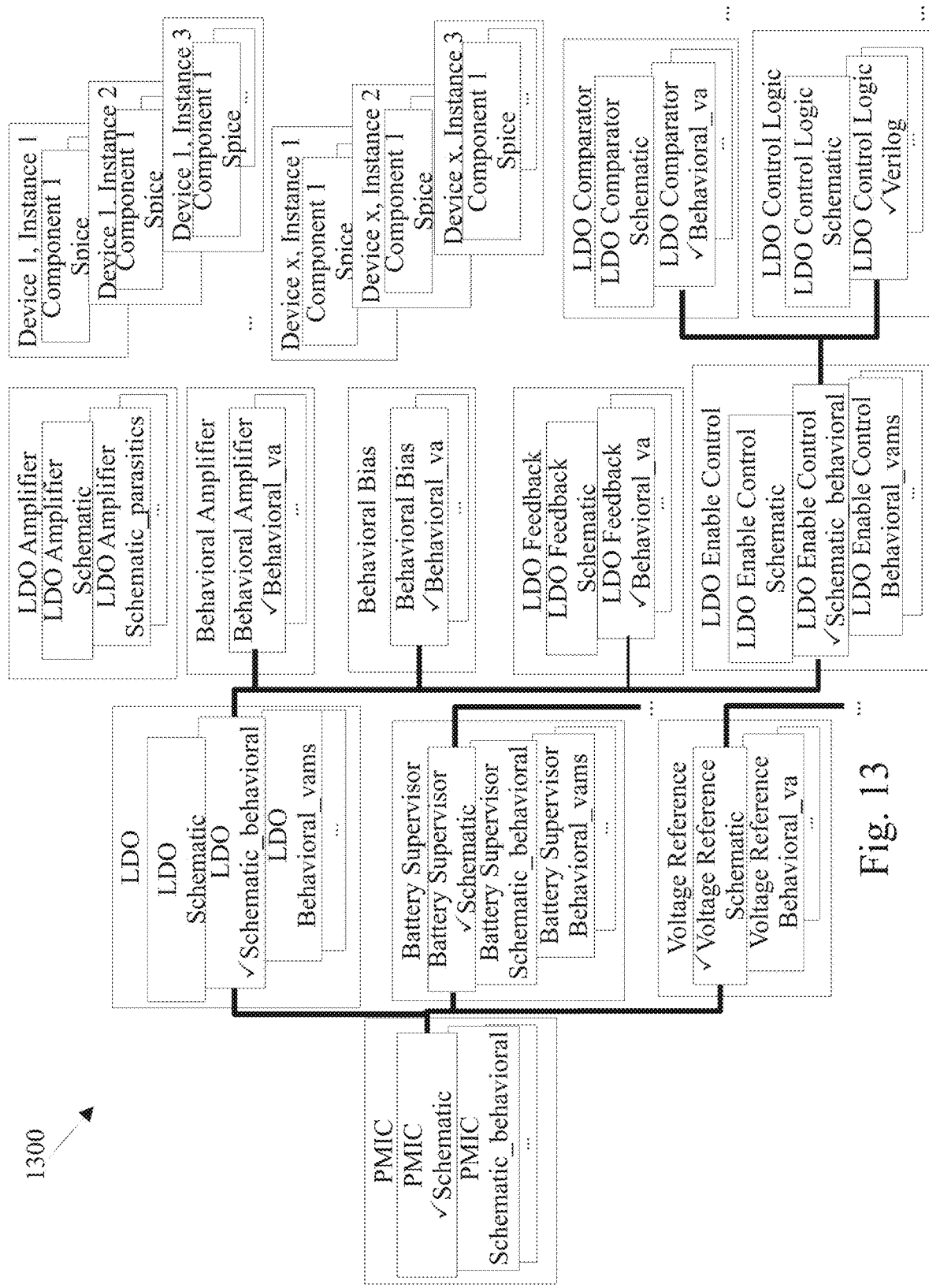
FIG. 13 depicts a second example design configuration for a power management integrated circuit.

FIG. 13 shows a test hierarchy for a power management chip 1300. The figure illustrates a portion of the hierarchy for one possible mixed configuration with some analog behavioral level models, some Verilog representations and some Spice primitive components.

Figure 14:
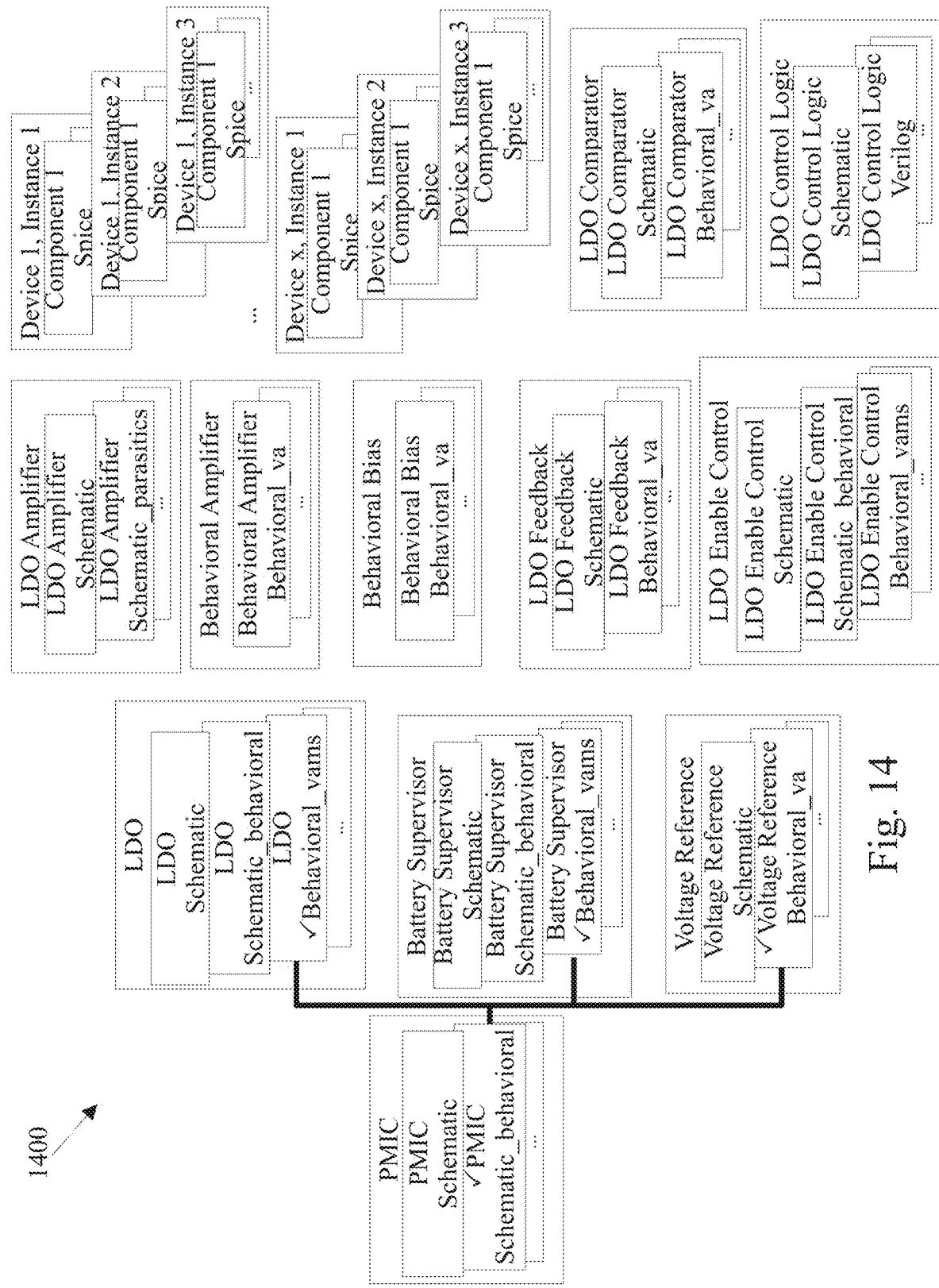
FIG. 14 depicts a third example design configuration for a power management integrated circuit.

FIG. 14 shows a test hierarchy for a power management chip 1400. The figure illustrates a portion of the hierarchy if a behavioral configuration is defined.

Figure 15:
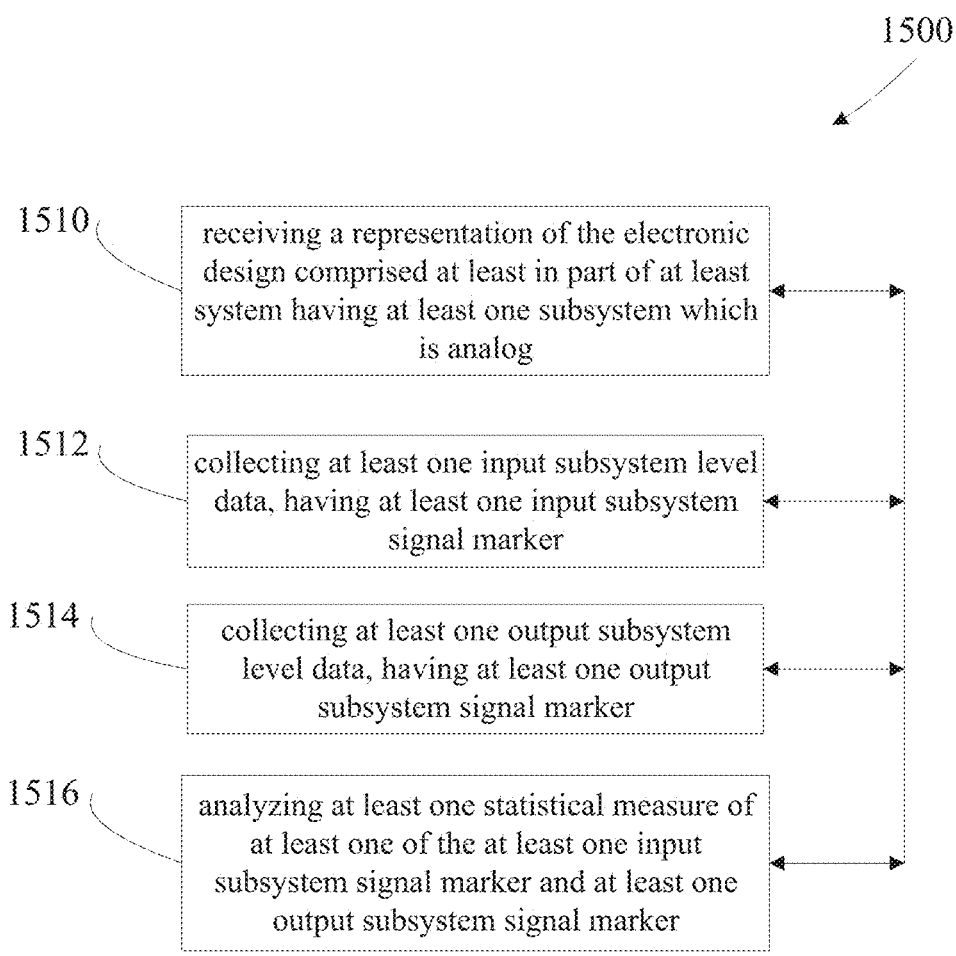
FIG. 15 depicts an example flow diagram of a method of operation, in accordance with one embodiment of the disclosure.
Figure 16:
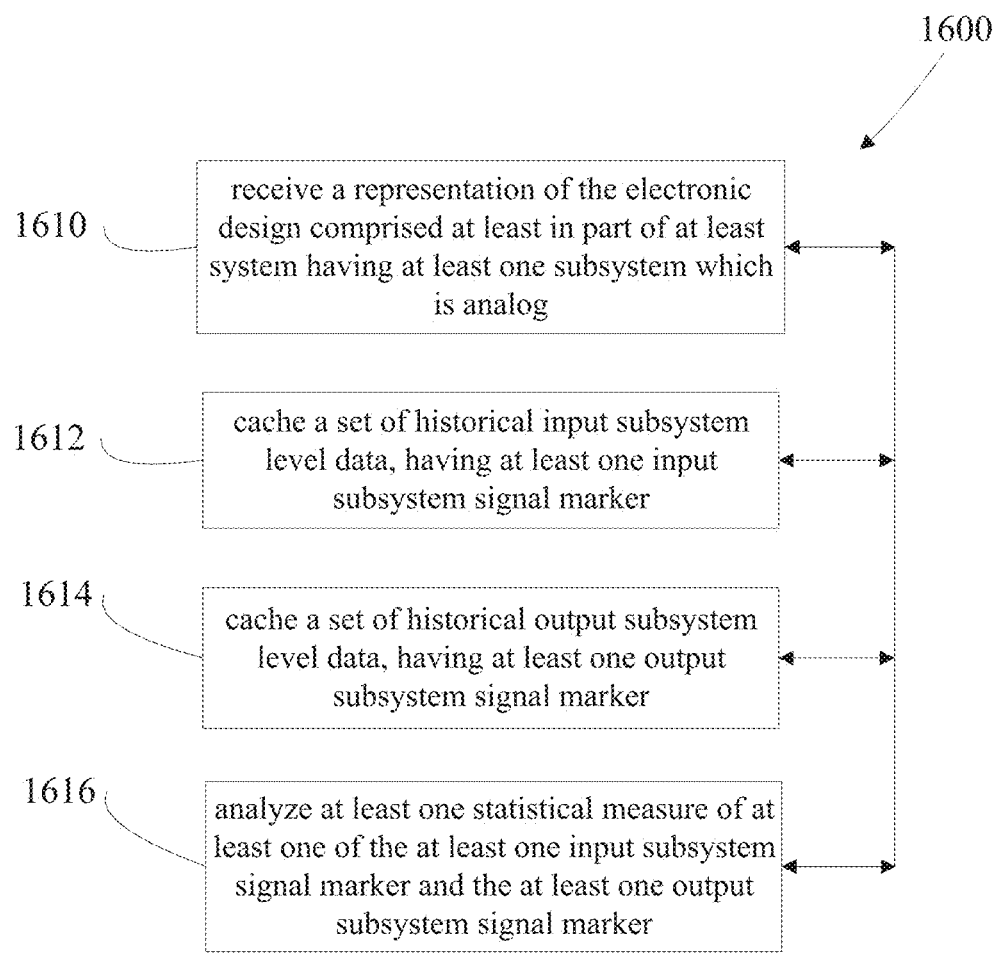
FIG. 16 depicts another example flow diagram of a method of operation of a system, in accordance with one embodiment of the disclosure.
Figure 17:
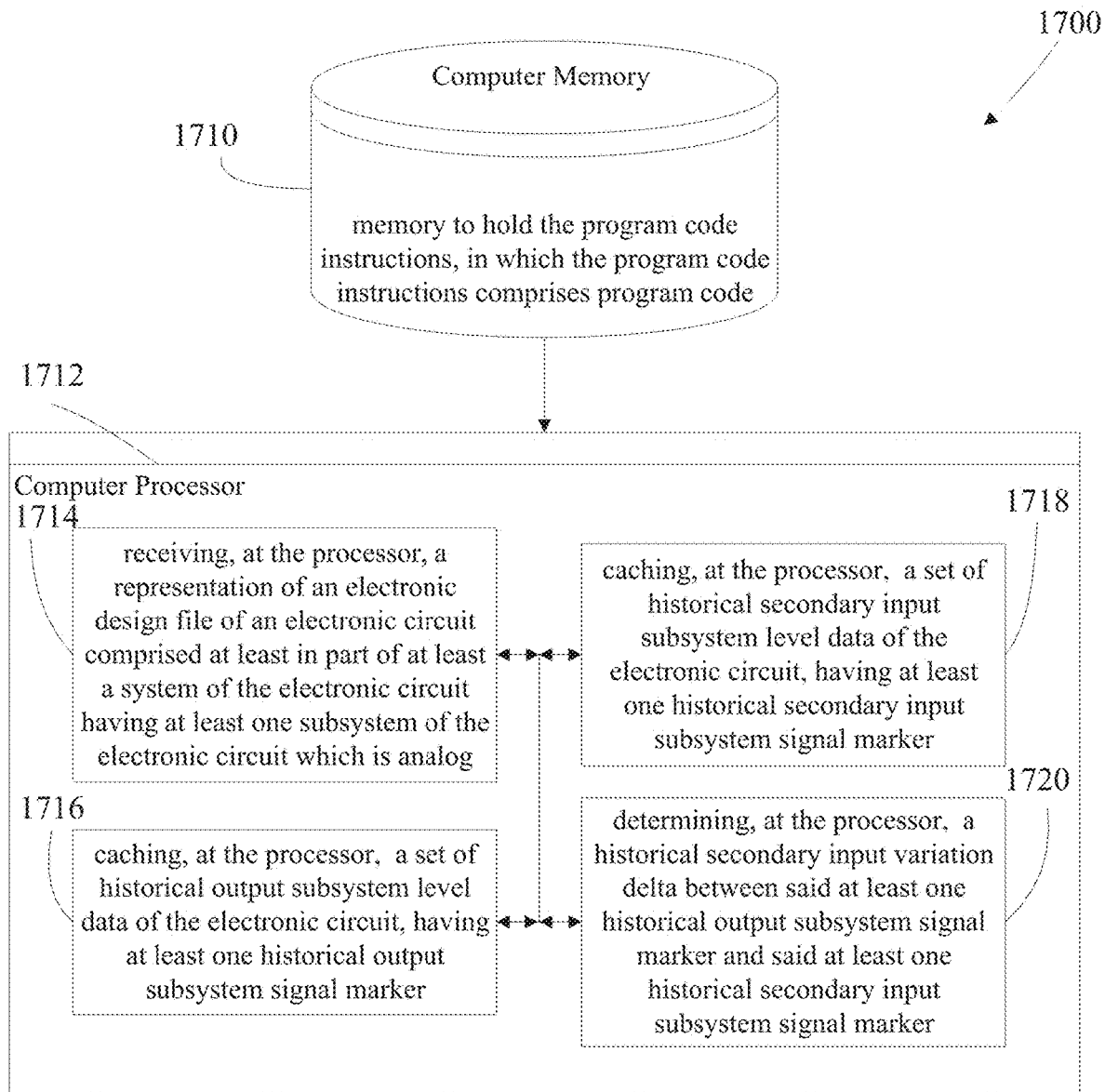
FIG. 17 depicts a further example flow diagram of a method of operation of a computer readable medium, in accordance with one embodiment of the disclosure.
Figure 18:
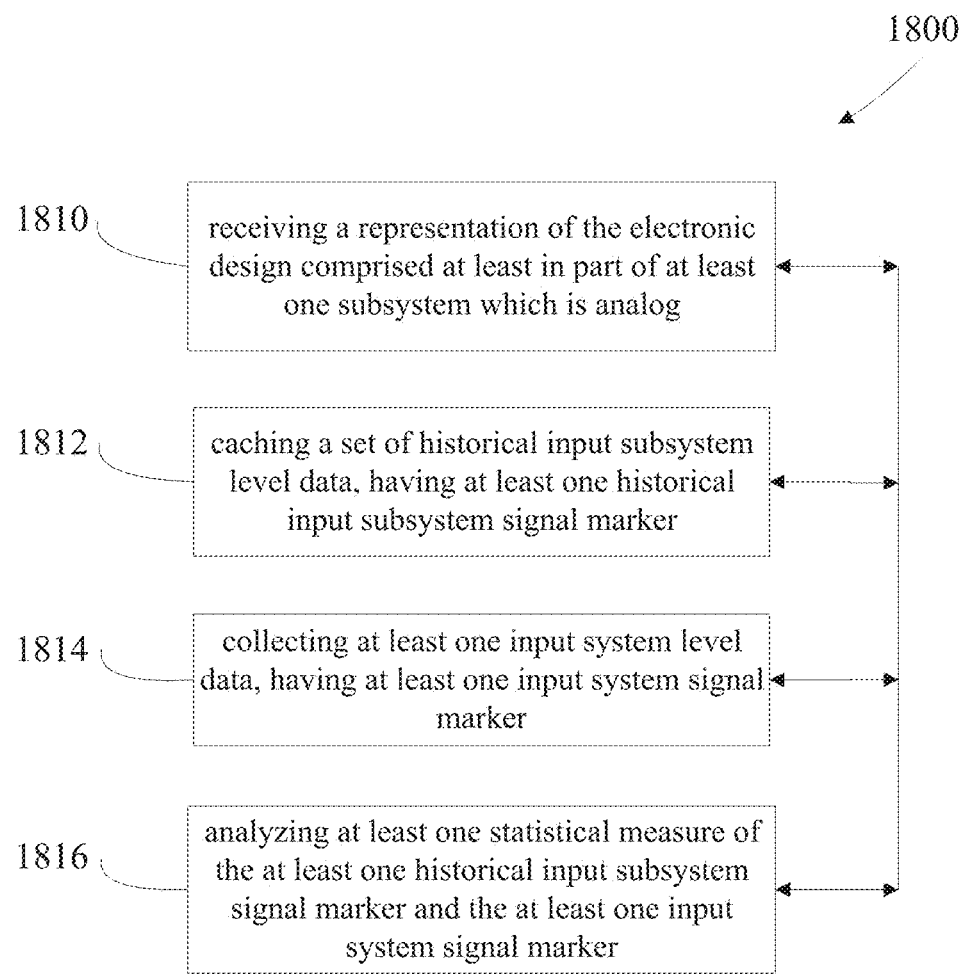
FIG. 18 depicts yet another example flow diagram of a method of operation of a system, in accordance with one embodiment of the disclosure.
Figure 19:
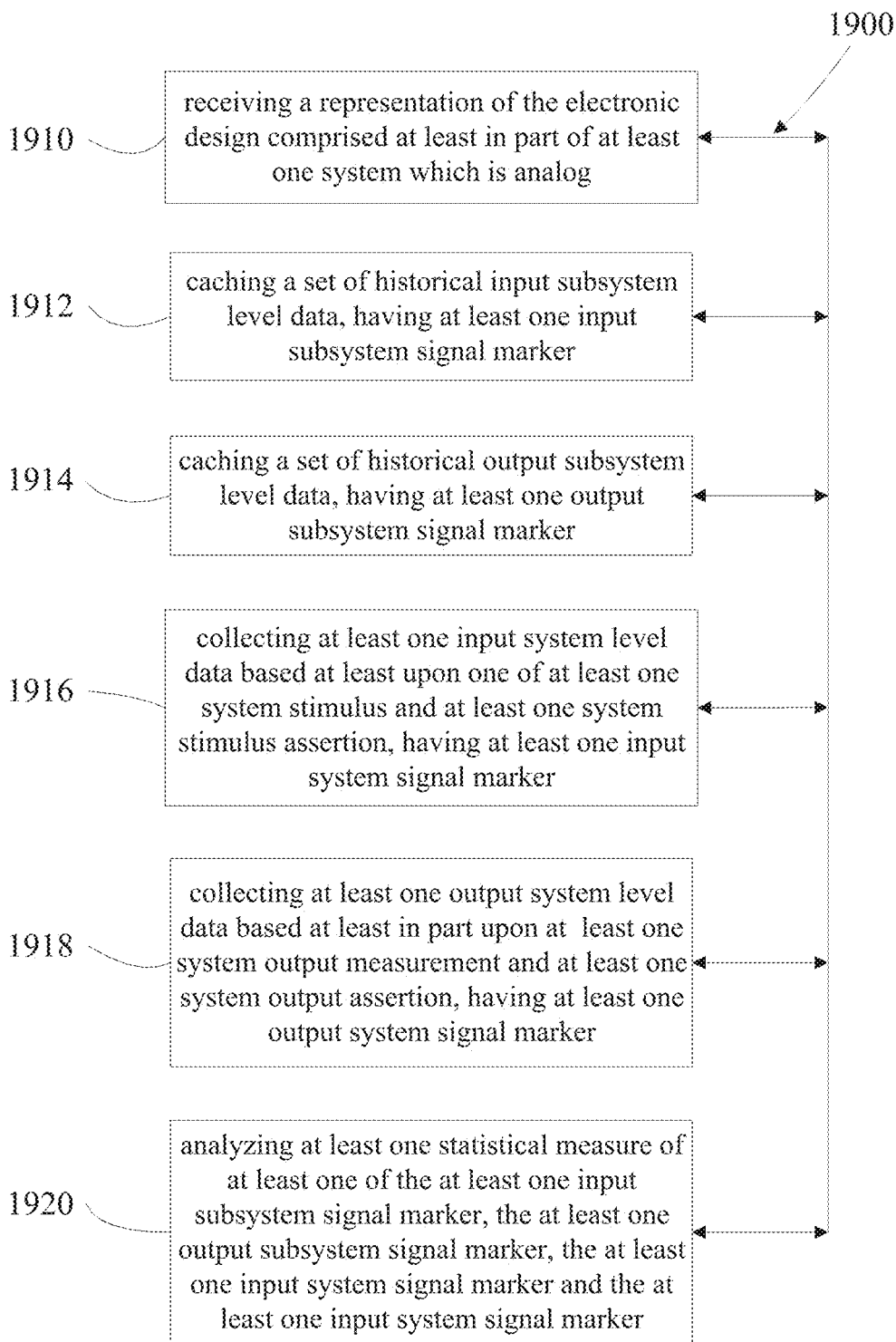
FIG. 19 depicts yet a further example flow diagram of a method of operation of a system, in accordance with one embodiment of the disclosure.

In one example, FIG. 15 illustrates A computer implemented method of passive verification of an electronic design 1500, comprising the steps of, receiving 1510 a representation of the electronic design comprised at least in part of at least system having at least one subsystem which is analog, collecting 1512 at least one input subsystem level data, having at least one input subsystem signal marker, collecting 1514 at least one output subsystem level data, having at least one output subsystem signal marker and analyzing 1516 at least one measure, which may be statistical, count, pareto and the like, of at least one of the at least one input subsystem signal marker and at least one output subsystem signal marker. The electronic design may be analog or mixed signal.

An example of this concept can be seen from the design hierarchy of FIG. 9. A power management integrated circuit may include a low-dropout regulator (LDO). Before including the LDO within the test, a design engineer has performed a series of simulations to verify and characterize the LDO. With this invention, the information related to the input stimulus and resulting output signals for those tests has been captured. When that LDO is then included in the larger design, the input stimulus applied to the LDO block at the system level (either an output from another block in the design or an external stimulus to the design) can be compared to the stimulus applied when the LDO was tested by itself. As a result, useful comparisons and predictions can be made to see if the systems tests adequately reflect the tests expected by the initial design of the LDO. Similar comparisons can be made by comparing outputs from the LDO during subsystem level verification as compared to during system level verification.

Some examples of the value that can be achieved by automatically leveraging the data from experiments performed on a portion of the design hierarchy, in this example, the LDO subsystem, include the following: 1) These comparisons may highlight unexpected problems for the LDO within the system context such as system interactions that cause the output to differ from the output generated when the block was tested by itself; 2) The comparisons may find different interpretations of the specification such as where stimulus generated at the system level do not correspond to the same range of input stimulus used when designing the block; 3) The comparisons may identify tests that the designer of the subsystem considered important and ran a large number of experiments but the system level tests do not validate (this is an example of a verification coverage issue). These are all just examples of the many applications for leveraging information from lower level tests when validating the full system. It is also envisioned that this electronic design may be extended to the verification of electromechanical, electrochemical and electrobiological systems.

Figure 20:
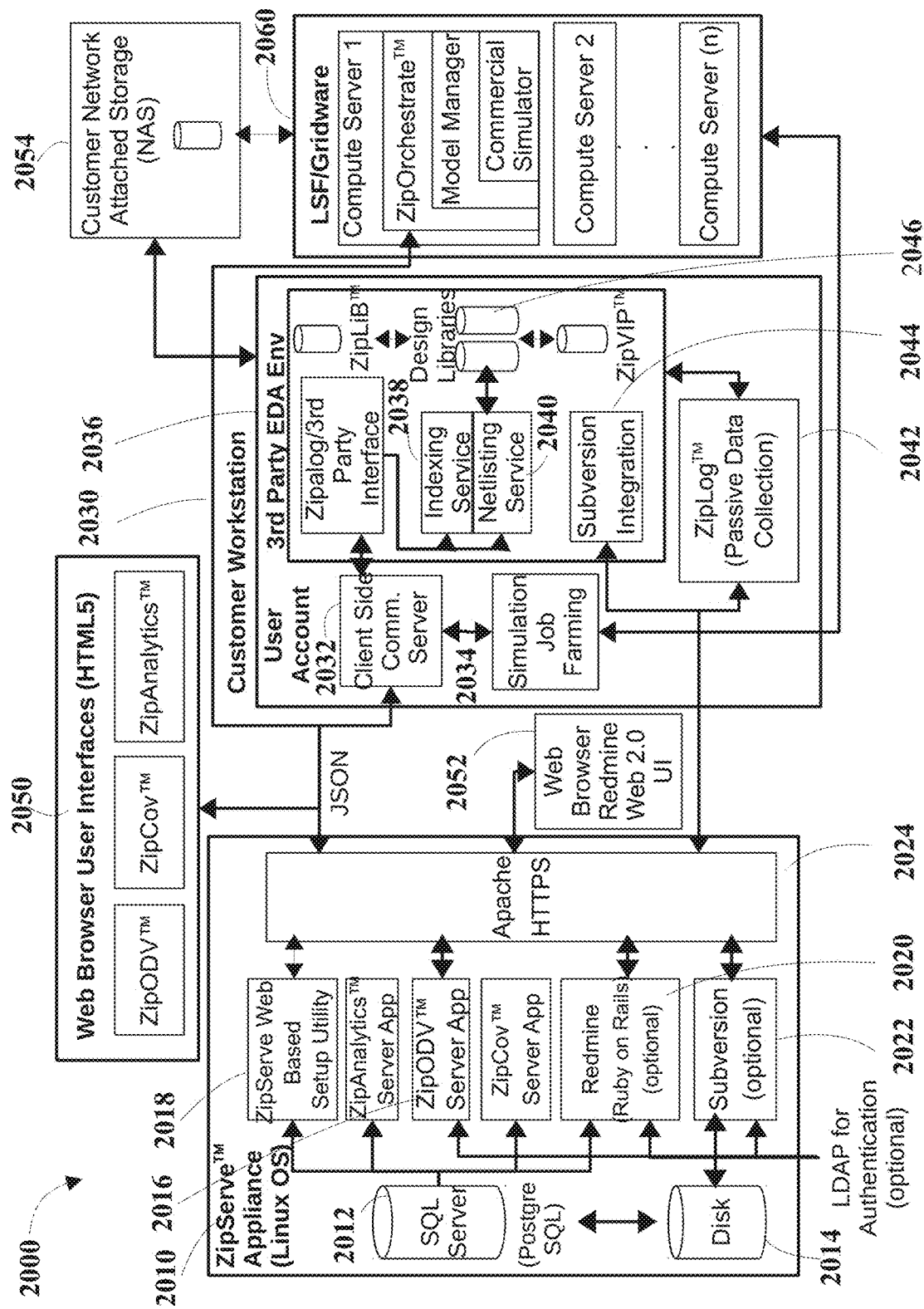
FIG. 20 depicts an example of a system that includes an embodiment of this invention.
Figure 21:
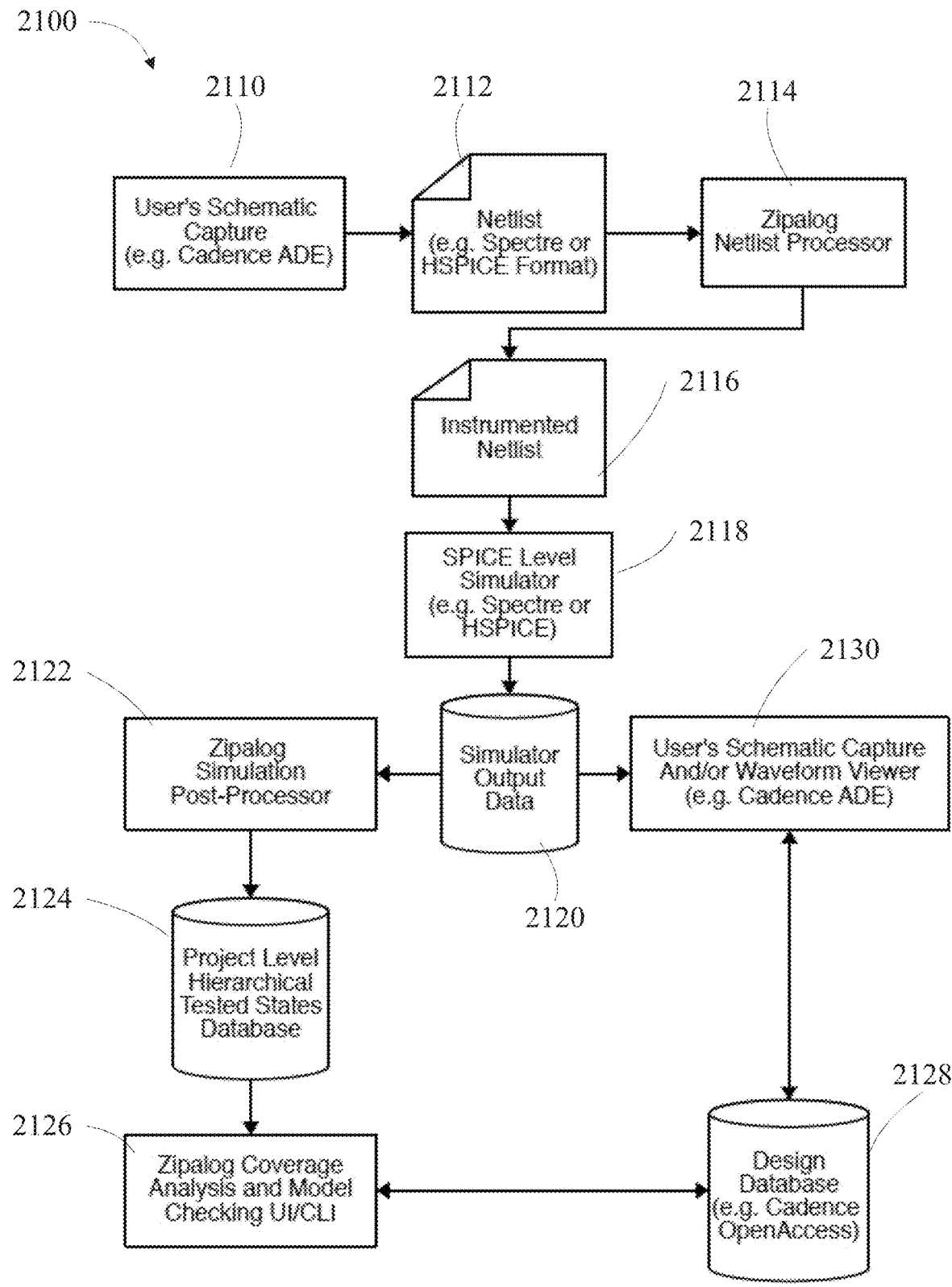
FIG. 21 depicts an example flow diagram of a method of collecting passive verification information.

This same invention can be applied for lateral passive verification applications across similar design elements. Consider two different integrated circuit designs similar to FIG. 9 that both contain a low dropout regulator. An engineer can leverage the data generated from the verification of the first LDO to evaluate the completeness of the verification of the second LDO. Lateral passive verification is an important concept for systematically improving verification over a class of similar design functions. For the purpose of this description, the term passive verification implies reusing verification information within the same design hierarchy while lateral passive verification is reusing the verification information from one design or portion of one design to a second design with a similar function. Digital integrated circuit design has been able to show productivity improvements with the growth of digital verification techniques and digital verification intellectual property (VIP) to ease the ability to exchange digital design data between groups and companies. Analog design has been more problematic as often analog circuit functions do not perform consistently when used in different designs, and present analog design methodology does not provide a comparable methodology to the digital verification flow and verification intellectual property. Lateral passive verification as described in this invention will enable independent concepts of analog verification intellectual property (IP) for actual circuit implementations and not just for use with higher-level abstractions. Efficiently providing analog verification IP will greatly reduce issues encountered (today) when trying to share analog IP across groups or companies. One example embodiment of this invention as shown in FIG. 20 and FIG. 21 provides a solution that performs efficiently and collects a new type of data from the design simulation flow specifically focused on verification results. Design organizations and management will have much more actionable data from the design process and data that is transportable to be carried with a specific design or applied to other similar designs.

One computer implemented embodiment of this invention is shown in FIG. 20 and FIG. 21. FIG. 20 shows the overall system 2000 which is implemented in a client-server architecture common to many computing applications today. The server side 2010 of the application contains the primary database 2012 and computational engines 2018 for this invention. The machine hosting the server (in this example a LINUX OS based computer) needs reasonable bandwidth internet access and compute power. The client 2030 is a device with web browsing access. The client device also need to be able to access either through the internet or locally the machines where the actual design of the integrated circuit is occurring and being verified. The client side communication server 2032 initiates many of the functions performed within the design environment such as accessing the design database and starting various job functions through the electronic design automation system (for example, Cadence Virtuoso from Cadence Design Systems) being used. The client server manages the functions 2038, 2040, 2042 that perform the passive verification activities and those results are supplied back to the server side 2010 of the application and stored in the database 2012. With the sensitivity of maintain security for the actual design intellectual property, it is important to note that none of the actual design data is moved from the client side of the activities to the server side. Only the information related to verification states, status, coverage and results are available within the server. FIG. 21 shows the overall flow that creates the database for the passive verification data. The netlist 2112 generated by the user's chosen electronic design environment 2110 is instrumented 2116 by a netlist preprocessor 2114 in order to have the analog simulator 2118 collect information related to the verification process. The simulator outputs data 2120 as the simulation executes. The data collected for passive verification results is post-processed 2122 and sent to the appropriate project level hierarchical tested states database 2124. The server application 2018 keeps track of key circuits that need to be verified through simulation and determines what simulations need to be run based on changes to circuit collateral, re-runs the minimum set of simulations to bring results up-to-date, captures results defined by design specifications, and analyzes verification coverage. The database 2124 is able to accumulate coverage information across multiple simulations and test benches.

The computer implemented method may also comprise collecting at least one other input subsystem level data, having at least one other input subsystem signal marker, and collecting at least one other output subsystem level data, having at least one other output subsystem signal marker. The method may also comprise determining at least one input variation of the at least one other input subsystem level data to the at least one output subsystem level data, determining at least one output variation of the at least one other output subsystem level data to the at least one output subsystem level data and correlating the at least one output variation to the at least one input variation. The method may further comprise collecting at least one secondary input subsystem level data, determining at least one secondary input variation delta between the at least one output subsystem level data and the at least one secondary input subsystem level data and determining at least one input variation of the at least one secondary input subsystem level data to the at least one input subsystem level data. Further, the method may comprise determining at least one output variation of the at least one output subsystem level data to at least one output system level data and correlating the at least one output variation to the at least one input variation. The system may also comprise collecting at least one input system level data, determining at least one input system level variation delta between the at least one input system level data and the at least one input subsystem level data, collecting at least one secondary output subsystem level data, collecting at least one output system level data and determining at least one system level output variation delta between the at least one secondary output subsystem level data and the at least one output system level data. Also, the method may comprise receiving at least one analog test harness for the at least one subsystem and having at least one subsystem which is digital. Referring back to FIG. 11, the electronic design would encompass each connected block in the figure. The top level hierarchy is A1, the next level of hierarchy is B, which includes B1 and B2 and underneath the B hierarchy is the C hierarchy having C1, C2 and C3. In this specific example at the B1 level and below the model is comprised of Schematic and Spice models. At the B2 level the model encompasses Schematic_behavioral and Behavioral_va models. In this instance the analog test model would be connected to A1, instance 1 level and would be connected through the netlist, connecting lines to each of the components under test.

The hierarchy examples all help show the complexity contained within integrated circuits. The interactions between the various pieces of the hierarchy can be complex and cross across multiple design boundaries in terms of who designed a function and when it was designed. Individual portions of the design may have been designed for other projects and be reused within a new project. The original design engineer for the subsystem is often not available to review the subsystem performance within the larger system. The interactions across the hierarchy are often complex as seen in FIG. 9 in terms of one block's output 922 creating another block's input 924. The second block can also generate outputs 928 that become an input for the first block. This example is simple in terms of number of blocks and interactions across the block boundaries. Today, even within the primarily analog portions of the designs, thousands of signals may pass across the block boundaries throughout the hierarchy. Existing prior art for analog designs involve saving information through specifications, design review documents, application notes, and tables of simulation runs. This invention allows for a programmatic capture of analog stimulus and output that then is managed in such a manner as to be available for the system verification. Because the data is collected automatically and managed through a database available throughout the design process, there are numerous new applications not previously practical during the analog design process. Furthermore this approach works with analog schematics that contain traditional component representations (transistors, resistors, capacitors, etc.) and not just with behavioral representations of the design such as verilogAMS, verilog with real numbers, VHDL, etc. FIGS.

16-19 show various examples of interacting with data across the multiple levels of hierarchy and multiple interactions between portions of the hierarchy.

An apparatus to passively verify an electronic design 1600, comprising, a processor configured to receive 1610 a representation of the electronic design comprised at least in part of at least system having at least one subsystem which is analog, cache 1612 a set of historical input subsystem level data, having at least one input subsystem signal marker and cache 1614 a set of historical output subsystem level data, having at least one output subsystem signal marker. The processor further analyzes 1616 at least one measure, which may be statistical, count, pareto and the like, of at least one of the at least one input subsystem signal marker and the at least one output subsystem signal marker. Returning back to FIG. 7, the electronic design would encompass each of the connected blocks following the PMIC_testbench, and at least one analog test harness model would pertain to the block marked PMIC_testbench. The netlist for that model would indicate each connection, connecting line in FIG. 7. The hierarchies associated with this design indicate that the LDO, Battery Supervisor and Voltage Reference blocks are lower in hierarchy than the PMIC block. Additionally, this model primarily reviews the schematic portion of the design.

The processor may also determine a historical input variation of the set of historical input subsystem level data, determine a historical output variation of the set of historical output subsystem level data and correlate the historical output variation to the historical input variation. The processor may further cache a set of historical secondary input subsystem level data, determine a historical secondary input variation delta between the set of historical output subsystem level data and the set of historical secondary input subsystem level data, cache a set of historical secondary output subsystem level data, cache the set of historical output subsystem level data and determine a historical system level output variation delta between the set of historical secondary output subsystem level data and the set of historical output subsystem level data.

A non-transitory computer readable storage medium 1700 configured to store instructions 1710 that when executed causes a processor 1712 to perform receiving 1714, at the processor, a representation of an electronic design file of an electronic circuit comprised at least in part of at least a system of the electronic circuit having at least one subsystem of the electronic circuit which is analog and caching 1716, at the processor, a set of historical output subsystem level data of the electronic circuit, having at least one historical output subsystem signal marker. The instructions further comprising caching 1718, at the processor, a set of historical secondary input subsystem level data of the electronic circuit, having at least one historical secondary input subsystem signal marker and determining 1720, at the processor, a historical secondary input variation delta between said at least one historical output subsystem signal marker and said at least one historical secondary input subsystem signal marker. Referring back to FIG. 8, the electronic design would encompass each of the connected blocks following the PMIC_testbench, and at least one analog test harness model would pertain to the block marked PMIC_testbench. The netlist would indicate the connectivity, shown by the lines connecting each of the blocks. The hierarchies associated with this design indicate that the LDO, Battery Supervisor and Voltage Reference blocks are lower in hierarchy than the PMIC block. This model reviews the schematic, schematic behavioral and behavioral.va aspects of the model. Though the overall electronic design is the same as in FIG. 7, what is tested, the hierarchies and connectivity are different.

The processor may also perform determining a historical system level output variation delta between the set of historical output subsystem level data and a set of historical secondary output subsystem level data.

A computer implemented method of passive verification of an electronic design 1800, comprising the steps of, receiving 1810 a representation of the electronic design comprised at least in part of at least one subsystem which is analog and caching 1812 a set of historical input subsystem level data, having at least one historical input subsystem signal marker. The method also performs collecting 1814 at least one input system level data, having at least one input system signal marker and analyzing 1816 at least one measure, which may be statistical, count, pareto and the like, of the at least one historical input subsystem signal marker and the at least one input system signal marker. Referring back to FIG. 10, the electronic design would encompass each of the connected blocks following the PMIC_testbench, and at least one analog test harness model would pertain to the block marked PMIC_testbench. In this example the PMIC hierarchy and the LDO, Battery Supervisor and Voltage Reference hierarchies are reviewed. At the highest level the PMIC is reviewed at the schematic level and the LDO at the Behavioral_vams, the Battery Supervisor at the Behavioral_vams and the Voltage reference at the Behavioral_va level.

The method may also comprise receiving at least one analog test harness model for at least one of at least one subsystem and at least one system and correlating the at least one input system level data and at least one output system level data that is based at least in part upon the at least one measure, which may be statistical, count, pareto and the like, wherein the input system level data comprises at least one of at least one system stimulus and at least one system stimulus assertion and the output system level data comprises at least one of at least one system stimulus and at least one system stimulus assertion.

A computer implemented method of passive verification of an electronic design 1900, comprising the steps of, receiving 1910 a representation of the electronic design comprised at least in part of at least one system which is analog, caching 1912 a set of historical input subsystem level data, having at least one input subsystem signal marker and caching 1914 a set of historical output subsystem level data, having at least one output subsystem signal marker. The method also comprises collecting 1916 at least one input system level data based at least upon one of at least one system stimulus and at least one system stimulus assertion, having at least one input system signal marker, collecting 1918 at least one output system level data based at least in part upon at least one system output measurement and at least one system output assertion, having at least one output system signal marker and analyzing 1920 at least one measure, which may be statistical, count, pareto and the like, of at least one of the at least one input subsystem signal marker, the at least one output subsystem signal marker, the at least one input system signal marker and the at least one input system signal marker.

The method may further comprise identifying correlation similarity and assessing the identified correlation similarity to suggest at least one output system level data wherein the measure, which may be statistical, count, pareto and the like, is based at least in part upon a probability of recurrence of simulating the at least upon one of at least one subsystem stimulus and at least one subsystem stimulus assertion and/or at least one of at least one subsystem output measurement and at least one subsystem output assertion. Referring back to FIG. 7, the electronic design would encompass each of the connected blocks following the PMIC_testbench, and at least one analog test harness model would pertain to the block marked PMIC_testbench. The netlist for that model would indicate each connection, connecting line in FIG. 7. The hierarchies associated with this design indicate that the LDO, Battery Supervisor and Voltage Reference blocks are lower in hierarchy than the PMIC block. Additionally, this model primarily reviews the schematic portion of the design.

While the making and using of various exemplary examples of the disclosure are discussed herein, it is to be appreciated that the present disclosure provides concepts which may be described in a wide variety of specific contexts. Although the disclosure has been shown and described with respect to a certain example, it is obvious that equivalents and modifications will occur to others skilled in the art upon the reading and understanding of the specification. The present disclosure includes such equivalents and modifications, and is limited only by the scope of the following claims.

It is to be understood that the method and apparatus may be practiced locally or remotely and that the data for steps may be stored either locally or remotely. For purposes of clarity, detailed descriptions of functions, components, and systems familiar to those skilled in the applicable arts are not included. The methods and apparatus of the disclosure provide one or more advantages including which are not limited to, improved speed efficiency, decreased computation, decreased number of re-verifications and the like. While the disclosure has been described with reference to certain illustrative examples, those described herein are not intended to be construed in a limiting sense. For example, variations or combinations of steps or materials in the examples shown and described may be used in particular cases while not departing from the disclosure. Various modifications and combinations of the illustrative examples as well as other advantages and examples will be apparent to persons skilled in the arts upon reference to the drawings, description, and claims.

What is claimed is:

1. A computer implemented method of passive verification of an electronic design, comprising the steps of:
    receiving a first electronic design file of a first electronic design comprised at least in part of a mixed signal or analog system, the first electronic design file including at least one first system and first subsystem;
    collecting first input data from at least one first system input and first subsystem input;
    analyzing a first parameter of the first input data;
    receiving a second electronic design file of a second electronic design comprised at least in part of a mixed signal or analog system, the second electronic design file including at least one second system and second subsystem that are comparable in function to the at least one first system and first subsystem of the first electronic design file;
    collecting second input data from at least one second system input and second subsystem input of a second design file;
    analyzing the first parameter of the second input data;
    comparing the analysis of the first parameter of the first input data of the at least one first system and first subsystem in a first design file to the analysis of the first parameter of the second input data of the at least one second system and second subsystem in the second design file; and
    repeating the step of comparing the analysis of the first parameter for a series of input parameters to build a history of verification coverage of input parameters of the at least one second system and second subsystem of the second design file relative to the at least one first system and first subsystem of the first design file.

2. The computer implemented method of passive verification of said electronic design of claim 1 further comprising the steps of:
    collecting first output data from at least one first system output and first subsystem output in response to the first input data;
    analyzing a second parameter of the first input data with respect to the first output data;
    collecting second output data from at least one second system output and the at least second subsystem output;
    analyzing the second parameter of the second input data with respect to the second output data;
    comparing the analysis of the second parameter of the at least one first system and the first subsystem in the first design file to the analysis of the second parameter of the at least one second system and second subsystem in a second design file; and
    repeating the comparing the analysis of the second parameter for a series of the second parameters to build the history of verification coverage of the at least one second system and second subsystem of the second design file relative to the at least one first system and first subsystem of the first design file.

3. The computer implemented method of passive verification of said electronic design of claim 1, further comprising:
    collecting at least one second input data from an analog stimulus to the at least one first system and first subsystem which is analog, having at least one second input to the at least one first system and first subsystem; and
    collecting at least one other output data, having at least one second output of the at least one first system and first subsystem.

4. The computer implemented method of passive verification of said electronic design of claim 3, further comprising:
    determining at least one input variation of the at least one second input to the at least one first system and first subsystem to at least one first output of the at least one first system and first subsystem;
    determining at least one output variation of at least one second output of the at least one second system and second subsystem to the at least one first output of the at least one first system and first subsystem; and
    correlating the at least one output variation to said at least one input variation.

5. The computer implemented method of passive verification of said electronic design of claim 1, further comprising:
    collecting at least one secondary input subsystem data from an analog stimulus to the at least one first system and first subsystem which is analog; and
    determining at least one secondary input variation delta between the at least one output variation of the at least one first system and first subsystem and an at least one secondary input to the at least one first system and first subsystem.

6. The computer implemented method of passive verification of said electronic design of claim 3, further comprising:
   determining at least one input variation of an at least one secondary input to the at least one first system and first subsystem to an at least one input to the at least one first system and first subsystem;
   determining at least one output variation of at least one of at least one secondary output from the at least one first system and first subsystem and at least one output from the at least one first system and first subsystem to at least one output of the at least one first system and first subsystem; and
   correlating the at least one output variation to said at least one input variation.

7. The computer implemented method of passive verification of said electronic design of claim 1, further comprising:
   collecting at least one input from the mixed signal or analog system; and
   determining at least one input system level variation delta between said at least one input to the mixed signal or analog system and said at least one input to the at least one first system or at least one first subsystem.

8. The computer implemented method of passive verification of the electronic design of claim 1, further comprising receiving at least one analog test harness for said at least one system or at least one subsystem.

9. The computer implemented method of passive verification of the electronic design of claim 1, further comprising having the at least one first system and first subsystem which is digital.

10. A computer implemented method of passive verification of an electronic design, comprising the steps of:
   receiving a first electronic design file of a first electronic design comprised at least in part of a mixed signal or analog system, an electronic design file including at least one of a first system and a first subsystem;
   collecting first input data from at least one first system input and first subsystem input;
   collecting first output data from at least one first system output and first subsystem output in response to the first input data;
   analyzing a first parameter of the first input data with respect to the first output data;
   receiving a second electronic design file of second electronic design comprised at least in part of a mixed signal or analog system, the second electronic design file including at least one second system and second subsystem that are comparable in function to the at least one first system and first subsystem of the first electronic design file;
   collecting second input data from the at least one second system input and second subsystem input;
   collecting second output data from at least one second system output and second subsystem output;
   analyzing the first parameter of the second input data with respect to the second output data;
   comparing the analysis of the first parameter of the at least one first system and first subsystem in a first design file to the analysis of the first parameter of the at least one second system and second subsystem in a second design file; and
   repeating the comparing the analysis of the first parameter for a series of input parameters to build a history of verification coverage of the at least one second system and second subsystem of the second design file relative to the at least one first system and first subsystem of the first design file.

11. The computer implemented method of passive verification of said electronic design of claim 10, further comprising:
   determining additional verification inputs as performed in a verification coverage history of a first design of the at least one first system and first subsystem that may be lacking in a current verification coverage of a second design of the at least one second system and second subsystem;
   predicting expected outputs relative to defined inputs for the at least one second system and second subsystem based on the verification coverage history from the first design of the at least one first system and subsystem; and
   identifying parameter output results for the at least one of the at least one second system and second subsystem that may indicate a design error in the at least one second system and second subsystem based on output results for a same parameter in the at least one first system and first subsystem.

12. The computer implemented method of passive verification of said electronic design of claim 10, further comprising:
   applying a verification coverage history to an additional at least one system and subsystem designs performing a similar function; and
   forming a knowledge base for analysis of expected performance impacts of various design differences in an implementation of a designated function using accumulated verification coverage histories and associated design file for each of the additional at least one system and subsystem over a series of circuit designs.

13. The computer implemented method of passive verification of said electronic design of claim 12, further comprising predicting design implementation for selected design targets for a similar function across many variations using the knowledge base of performance differences and tradeoffs correlated to differences in the design implementation for the similar function across many variations.

14. The computer implemented method of passive verification of said electronic design of claim 10, further comprising:
   collecting at least one second input data from an analog stimulus to the at least one first system and first subsystem which is analog, having at least one second input to the at least one first system and first subsystem; and
   collecting at least one other output data, having at least one second output of the at least one first system and first subsystem.

15. The computer implemented method of passive verification of said electronic design of claim 14, further comprising:
   determining at least one input variation of the at least one second input to the at least one first system and first subsystem to at least one first output of the at least one first system and first subsystem;
   determining at least one output variation of at least one second output of the at least one second system and second subsystem to the at least one first output of the at least one first system and first subsystem; and
   correlating the at least one output variation to said at least one input variation.

16. The computer implemented method of passive verification of said electronic design of claim 10, further comprising:
    collecting at least one secondary input subsystem data from an analog stimulus to the at least one first system and first subsystem which is analog; and
    determining at least one secondary input variation delta between the at least one output variation of the at least one first system and first subsystem and an at least one secondary input to the at least one first system and first subsystem.

17. The computer implemented method of passive verification of said electronic design of claim 14, further comprising:
    determining at least one input variation of an at least one secondary input to the at least one first system and first subsystem to an at least one input to the at least one first system and first subsystem;
    determining at least one output variation of at least one of at least one secondary output from the at least one first system and first subsystem and at least one output from the at least one first system and first subsystem to at least one output of the at least one first system and first subsystem; and
    correlating the at least one output variation to said at least one input variation.

18. The computer implemented method of passive verification of said electronic design of claim 10, further comprising:
    collecting at least one input from the mixed signal or analog system; and
    determining at least one input system level variation delta between said at least one input to the mixed signal or analog system and said at least one input to the at least one first system or at least one first subsystem.

19. The computer implemented method of passive verification of the electronic design of claim 10, further comprising receiving at least one analog test harness for said at least one system or at least one subsystem.

20. The computer implemented method of passive verification of the electronic design of claim 10, further comprising having the at least one first system and first subsystem which is digital.

* * * * *